US006947463B2

(12) United States Patent
Tsukiji et al.

(10) Patent No.: US 6,947,463 B2
(45) Date of Patent: Sep. 20, 2005

(54) SEMICONDUCTOR LASER DEVICE FOR USE IN A LASER MODULE

(75) Inventors: Naoki Tsukiji, Tokyo (JP); Junji Yoshida, Tokyo (JP); Masaki Funabashi, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 449 days.

(21) Appl. No.: 09/832,885

(22) Filed: Apr. 12, 2001

(65) Prior Publication Data

US 2002/0048300 A1 Apr. 25, 2002

(30) Foreign Application Priority Data

Oct. 23, 2000 (JP) ....................................... 2000-323118

(51) Int. Cl.[7] ................................................. H01S 5/10

(52) U.S. Cl. ............................ 372/50; 372/43; 372/44; 372/98; 372/102

(58) Field of Search ............................. 372/43–50, 98, 372/102

(56) References Cited

U.S. PATENT DOCUMENTS

| | | | | |
|---|---|---|---|---|
| 5,111,475 A | | 5/1992 | Ackerman et al. | |
| 5,278,851 A | * | 1/1994 | Goto ........................... | 372/19 |
| 5,991,061 A | | 11/1999 | Adams et al. | |
| 6,166,837 A | | 12/2000 | Adams et al. | |
| 6,363,097 B1 | * | 3/2002 | Linke et al. ................ | 372/102 |
| 6,567,447 B1 | | 5/2003 | Yoshida et al. | |
| 6,614,822 B2 | | 9/2003 | Yoshida et al. | |
| 2001/0036004 A1 | | 11/2001 | Ackerman et al. | |

FOREIGN PATENT DOCUMENTS

| | | |
|---|---|---|
| EP | 0 479 279 | 4/1992 |
| EP | 1 130 704 | 9/2001 |
| GB | 2 347 520 | 9/2000 |
| JP | 2-272432 | 11/1990 |
| JP | 4-29387 | 1/1992 |
| JP | 4-142788 | 5/1992 |

OTHER PUBLICATIONS

Talneau et al, "Multiple distributed feedback operation at 1.55 micron with uniform output powers in a single laser diode", Applied Physics Letters, vol. 75, No. 5, pp. 600–602 (Aug. 2, 1999), as submitted by Applicant in IDS of Nov. 17, 2003.*

Yoon et al, "Effects of Frequency Chirp in a Directly Modulated Multi–Longitudinal Mode Laser Diode using Time Domain Modeling with Random Noise Fluctuations", in Lasers and Electro–Optics, 1999 CLEO/Pacific Rim '99 (INSPEC Access #: 6544626).*

(Continued)

*Primary Examiner*—Nathan J. Flynn
*Assistant Examiner*—Johannes Mondt
(74) *Attorney, Agent, or Firm*—Oblon, Spivak, McClelland, Maier & Neustadt, P.C.

(57) ABSTRACT

A semiconductor laser device, module, and method for providing light suitable for providing an excitation light source for a Raman amplifier. The semiconductor laser device includes an active layer configured to radiate light, a spacer layer in contact with the active layer and a diffraction grating formed within the spacer layer, and configured to emit a light beam having a plurality of longitudinal modes within a predetermined spectral width of an oscillation wavelength spectrum of the semiconductor device. A plurality of longitudinal modes within a predetermined spectral width of an oscillation wavelength spectrum is provided by changing a wavelength interval between the longitudinal modes and/or widening the predetermined spectral width of the oscillation wavelength spectrum. The wavelength interval is set by the length of a resonator cavity within the semiconductor laser device, while the predetermined spectral width of the oscillation wavelength spectrum is set by either shortening the diffraction grating or varying a pitch of the grating elements within the diffraction grating.

62 Claims, 19 Drawing Sheets

OTHER PUBLICATIONS

Menna et al, "High Power 1550 nm Distributed Feedback Lasers with 440 mW CW Output Power for Tlecommunication Applications", CLEO / QELS Conf., Baltimore, MD (May 9, 2001) as listed on IDS dated Apr. 9, 2002.*

"Design and simulation of a dual mode semiconductor laser using sampled grating DFB structure," M. Hussein Mourad, J.P. Vilcot, D. decoster and D. Marcenac, Institution of Electrical Engineers, vol. 147, No. 1, Feb. 2000.

A. Talneau, et al., Applied Physics Letters, vol. 75, No. 5, pp. 600–602, XP–000875501, "Multiple Distributed Feedback Operation at 1.55$\mu$m with Uniform Output Powers in a Single Laser Diode", Aug. 2, 1999.

U.S. Appl. No. 09/537,216, filed Mar. 29, 2000, pending.

U.S. Appl. No. 09/676,989, filed Oct. 2, 2000, pending.

U.S. Appl. No. 09/769,395, filed Jan. 26, 2001, pending.

U.S. Appl. No. 09/793,881, filed Feb. 28, 2001, pending.

U.S. Appl. No. 09/828,144, filed Apr. 9, 2001, pending.

U.S. Appl. No. 09/865,444, filed May 29, 2001, pending.

U.S. Appl. No. 09/874,278, filed Jun. 6, 2001, pending.

U.S. Appl. No. 09/983,249, filed Oct. 23, 2001, pending.

U.S. Appl. No. 09/983,175, filed Oct. 23, 2001, pending.

U.S. Appl. No. 09/930,130, filed Aug. 16, 2001, pending.

U.S. Appl. No. 09/987,536, filed Nov. 15, 2001, pending.

U.S. Appl. No. 10/015,656, filed Dec. 17, 2001, pending.

U.S. Appl. No. 10/014,513, filed Dec. 14, 2001, pending.

U.S. Appl. No. 10/107,077, filed Mar. 28, 2002, pending.

U.S. Appl. No. 10/161,706, filed Jun. 5, 2002, pending.

Menna, R., DiMarco, L., Connolly, J., Garbuzov D., *High Power 1550 nm Distributed Feedback Lasers with 440 mW CW Output Power for Telecommunications Applications,* Submitted to CLEO/QELS Conference in Baltimore, MD on May 9, 2001.

English Translation of Japanese Patent Application 309188/1991, published Jun. 11, 1993, Junnichi Kinoshita, Fiber Amplifier Exciting Distributed Feedback Type Semiconductor Laser Not found in the file. Please provide.

* cited by examiner

SEMICONDUCTOR LASER DEVICE FOR USE IN A LASER MODULE

BACKGROUND OF THE INVENTION

1. Field of the Invention

The present invention relates to a semiconductor laser device for use in a semiconductor laser module suitable as an excitation light source for a Raman amplification system.

2. Discussion of the Background

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm which have reduced light absorption properties for optical fibers. However, in order to increase the data transmission capacity of such single fiber systems, it was necessary to increase the number of optical fibers laid on a transmission route which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known in to one of ordinary skill in the art, a Raman scattering effect causes a gain for optical signals having a frequency approximately 13 THz smaller than the frequency of the pumping beam. Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

Although the Raman amplifier amplifies signals over a wide wavelength band, the gain of a Raman amplifier is relatively small and, therefore, it is preferable to use a high output laser device as a pumping source. However, merely increasing the output power of a single mode pumping source leads to undesirable stimulated Brillouin scattering and increased noises at high peak power values. Therefore, the Raman amplifier requires a pumping source laser beam having a plurality of oscillating longitudinal modes. As seen in FIGS. 15A and 15B, stimulated Brillouin scattering has a threshold value $P_{th}$ at which the stimulated Brillouin scattering is generated. For a pumping source having a single longitudinal mode as in the oscillation wavelength spectrum of FIG. 15A, the high output requirement of a Raman amplifier, for example 300 mw, causes the peak output power of the single mode to be higher than $P_{th}$ thereby generating undesirable stimulated Brillouin scattering. On the other hand, a pumping source having multiple longitudinal modes distributes the output power over a plurality of modes each having relatively a low peak value. Therefore, as seen in FIG. 15B, a multiple longitudinal mode pumping source having the required 300 mw output power can be acquired within the threshold value $P_{th}$ thereby eliminating the stimulated Brillouin scattering problem and providing a larger Raman gain.

In addition, because the amplification process in a Raman amplifier is quick to occur, when a pumping light intensity is unstable, a Raman gain is also unstable. These fluctuations in the Raman gain result in fluctuations in the intensity of an amplified signal which is undesirable for data communications. Therefore, in addition to providing multiple longitudinal modes, the pumping light source of a Raman amplifier must have relatively stable intensity.

Moreover, Raman amplification in the Raman amplifier occurs only for a component of signal light having the same polarization as a pumping light. That is, in the Raman amplification, since an amplification gain has dependency on a polarization, it is necessary to minimize an influence caused by the difference between a polarization of the signal light beam and that of a pumping light beam. While a backward pumping method causes no polarization problem because the difference in polarization state between the signal light and the counter-propagating pumping light is averaged during transmission, a forward pumping method has a strong dependency on a polarization of pumping light because the difference in polarization between the two co-propagating waves is preserved during transmission Therefore, where a forward pumping method is used, the dependency of Raman gain on a polarization of pumping light must be minimized by polarization-multiplexing of pumping light beams, depolarization, and other techniques for minimizing the degree of polarization (DOP). In this regard it is known that the multiple longitudinal modes provided by the pumping light source help to provide this minimum degree of polarization FIG. 16 is a block diagram illustrating a configuration of the conventional Raman amplifier used in a WDM communication system. In FIG. 16, semiconductor laser modules 182*a* through 182*d*, include paired Fabry-Pérot type semiconductor light-emitting elements 180*a* through 180*d* having fiber gratings 181*a* through 181*d* respectively. The laser modules 182*a* and 182*b* output laser beams having the same wavelength via polarization maintaining fiber 71 to polarization-multiplexing coupler 61*a*. Similarly the laser modules 182*c* and 182*d* output laser beams having the same wavelength via polarization maintaining fiber 71 to polarization-multiplexing coupler 61*b*. Each polarization maintaining fiber 71 constitutes a single thread optical fiber which has a fiber grating 181*a*–181*d* inscribed on the fiber. The polarization-multiplexing couplers 61*a* and 61*b* respectively output the polarization-multiplexed laser beams to a WDM coupler 62. These laser beams outputted from the polarization-multiplexing couplers 61*a* and 61*b* have different wavelengths.

The WDM coupler 62 multiplexes the laser beams outputted from the polarization-multiplexing couplers 61*a* and 61*b*, and outputs the multiplexed light beams as a pumping light beam to external isolator 60, which outputs the beam to amplifying fiber 64 via WDM coupler 65. Signal light beams to be amplified are input to amplifying fiber 64 from signal light inputting fiber 69 via polarization-dependent isolator 63. The amplified signal light beams are Raman-amplified by being multiplexed with the pumping light beams and input to a monitor light branching coupler 67 via the WDM coupler 65 and the polarization-dependent isolator 66. The monitor light branching coupler 67 outputs a portion of the amplified signal light beams to a control circuit 68, and the remaining amplified signal light beams as an output laser beam to signal light outputting fiber 70. The control circuit 68 performs feedback control of a light-emitting state, such as, an optical intensity, of each of the semiconductor light-emitting elements 180*a* through 180*d* based on the portion of the amplified signal light beams input to the control circuit 68 such that the resulting Raman amplification gain is flat over wavelength.

FIG. 17 is an illustration showing a general configuration of a conventional fiber grating semiconductor laser module 182*a*–182*d* used in the conventional Raman amplifier system of FIG. 16. As seen in FIG. 17, semiconductor laser module 201 includes a semiconductor light-emitting element (laser diode) 202 and an optical fiber 203. The semiconductor light-emitting element 202 has an active layer 221 provided with a light reflecting surface 222 at one end thereof, and a light irradiating surface 223 at the other end. Light beams generated inside the active layer 221 are reflected on the light reflecting surface 222 and output from the light irradiating surface 223.

Optical fiber 203 is disposed on the light irradiating surface 223 of the semiconductor light-emitting element 222, and is optically coupled with the light irradiating surface 223. Fiber grating 233 is formed at a position of a predetermined distance from the light irradiating surface 223 in a core 232 of the optical fiber 203, and the fiber grating 233 selectively reflects light beams of a specific wavelength. That is, the fiber grating 233 functions as an external resonator between the fiber grating 233 and the light reflecting surface 222, and selects and amplifies a laser beam of a specific wavelength which is then output as an output laser beam 241.

While the conventional fiber grating semiconductor laser module 182*a*–182*d* provides the multiple longitudinal modes necessary for use in a Raman amplifier, the fiber grating module of FIG. 17 is problematic in that it has a large value of relative intensity noise (RIN) which reflects large fluctuations in light intensity. As discussed above, this fluctuation in the pumping light intensity is undesirable for Raman amplification because it could generate a fluctuation in Raman gain which in turn causes the amplified signal to fluctuate. The large value RIN is especially undesirable for Raman amplifiers using a forward pumping method, where the signal light of weakened intensity and the pumping light of high intensity propagate in the same direction. Therefore, even though the conventional fiber grating laser module provides multiple longitudinal modes which allow a diminished degree of polarization as needed in a forward pumping method, the forward pumping method is not frequently used with the fiber grating module because of the high RIN of such module.

The mechanical structure of the fiber grating laser module also causes instability of the conventional pumping light source. Specifically, because the optical fiber 203 with fiber grating 233 is laser-welded to the package, mechanical vibration of the device or a slight shift of the optical fiber 203 with respect to the light emitting element 202 could cause a change in oscillating characteristics and, consequently, an unstable light source. This shift in the alignment of the optical fiber 203 and light emitting element 202 is generally caused by changes in ambient temperature. In this regard, such changes in ambient temperature also cause small changes in oscillation wavelength selected by the fiber grating 233, further contributing to instability of the pumping light source.

Yet another problem associated with the fiber grating laser module is the high loss caused by the need for an external isolator. In a laser module with a fiber grating, an isolator cannot be intervened between the semiconductor laser device and the optical fiber because the external cavity oscillation is governed by the reflection from the fiber grating. That is, the isolator would prevent the reflected light from the grating from returning to the semiconductor laser device. Therefore, the fiber grating laser module has a problem in that it is susceptible to reflection and easily influenced. Moreover, as seen in FIG. 16, a Raman amplifier system using the fiber grating module must use external isolator 60. As is known in the art, this isolator presents a relatively high loss to the pumping light due to a connection the collecting lens and output fiber of the external isolator.

SUMMARY OF THE INVENTION

Accordingly, one object of the present invention is to provide a laser device and method for providing a light source suitable for use as a pumping light source in a Raman amplification system, but which overcomes the above described problems associated with a fiber grating laser module.

According to a first aspect of the present invention, a semiconductor device having an active layer configured to radiate light, a spacer layer in contact with the active layer and a diffraction grating formed within the spacer layer is provided. The semiconductor device this aspect is configured to emit a light beam having a plurality of longitudinal modes within a predetermined spectral width of an oscillation wavelength spectrum of the semiconductor device.

In one embodiment of this aspect the invention, the semiconductor device includes a reflection coating positioned at a first end of the active layer and substantially perpendicular thereto, and an antireflection coating positioned at a second end of the active layer opposing the first end and substantially perpendicular to the active layer may be provided to define a resonant cavity within the active region. In this aspect, a length of the resonant cavity is at least 800 $\mu$m and no more than 3200 $\mu$m.

In another embodiment of the first aspect of the present invention, the diffraction grating may be formed substantially along an entire length of the active layer, or a shortened diffraction grating formed along a portion of an entire length of the active layer. In either of these configurations, the diffraction grating may comprise a plurality of grating elements having a constant or fluctuating pitch. Where a shortened diffraction grating is formed along a portion of the length of the active layer, a shortened diffraction grating may be placed in the vicinity of a reflection coating and/or in the vicinity of an antireflection coating of the semiconductor laser device. When placed in the vicinity of the antireflection coating, the shortened diffraction grating has a relatively low reflectivity, the antireflection coating has an ultra-low reflectivity of 2% or less, and the reflection coating has a high reflectivity of at least 80%. If placed in the vicinity of the reflection coating, the shortened diffraction grating has a relatively high reflectivity, the antireflection coating has a low reflectivity of approximately 1% to 5%, and the reflection coating has an ultra-low reflectivity of approximately 0.1% to 2% and more preferably 0.1 or less.

According to another aspect of the present invention, a method for providing light from a semiconductor laser device includes the steps of radiating light from an active layer of the semiconductor laser device, providing a diffraction grating within the semiconductor laser device to select a portion of the radiated light to be emitted by the semiconductor laser device as an output light beam, and selecting physical parameters of the semiconductor laser device such that the output light beam has an oscillation wavelength spectrum having a plurality of longitudinal modes located within a predetermined spectral width of the oscillation wavelength spectrum.

In this aspect of the invention, the step of selecting physical parameters may include setting a resonant cavity length of the semiconductor laser device to provide a predetermined wavelength interval between the plurality of longitudinal modes, or providing a chirped grating or setting a length of the diffraction grating to be shorter than a length of the active layer, to thereby widen the predetermined spectral width of the oscillation wavelength spectrum. Where the chirped grating is provided, a periodic or random fluctuation in the pitch of grating elements is provided. Where the length of the diffraction grating is set shorter than the active layer, reflective properties of the diffraction grating, and a reflection coating and antireflection coating of the laser device are set based on the position of the shortened diffraction grating within the device.

In yet another aspect of the present invention, a semiconductor laser device including means for radiating light within the semiconductor laser device, means for selecting a portion of the radiated light to be emitted by the semiconductor laser device as an output light beam, means for ensuring the output light beam has an oscillation wavelength spectrum having a plurality of longitudinal modes located within a predetermined spectral width of the oscillation wavelength spectrum are provided. In this aspect, the means for ensuring may include means for setting a wavelength interval between the plurality of longitudinal modes or means for setting the predetermined spectral width of the oscillation wavelength spectrum.

In still another aspect or the present invention, a semiconductor laser module is provided. In this aspect, the a semiconductor laser device of the laser module includes a semiconductor device having an active layer configured to radiate light, a spacer layer in contact with the active layer and a diffraction grating formed within the spacer layer is provided. The semiconductor device this aspect is configured to emit a light beam having a plurality of longitudinal modes within a predetermined spectral width of an oscillation wavelength spectrum of the semiconductor device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
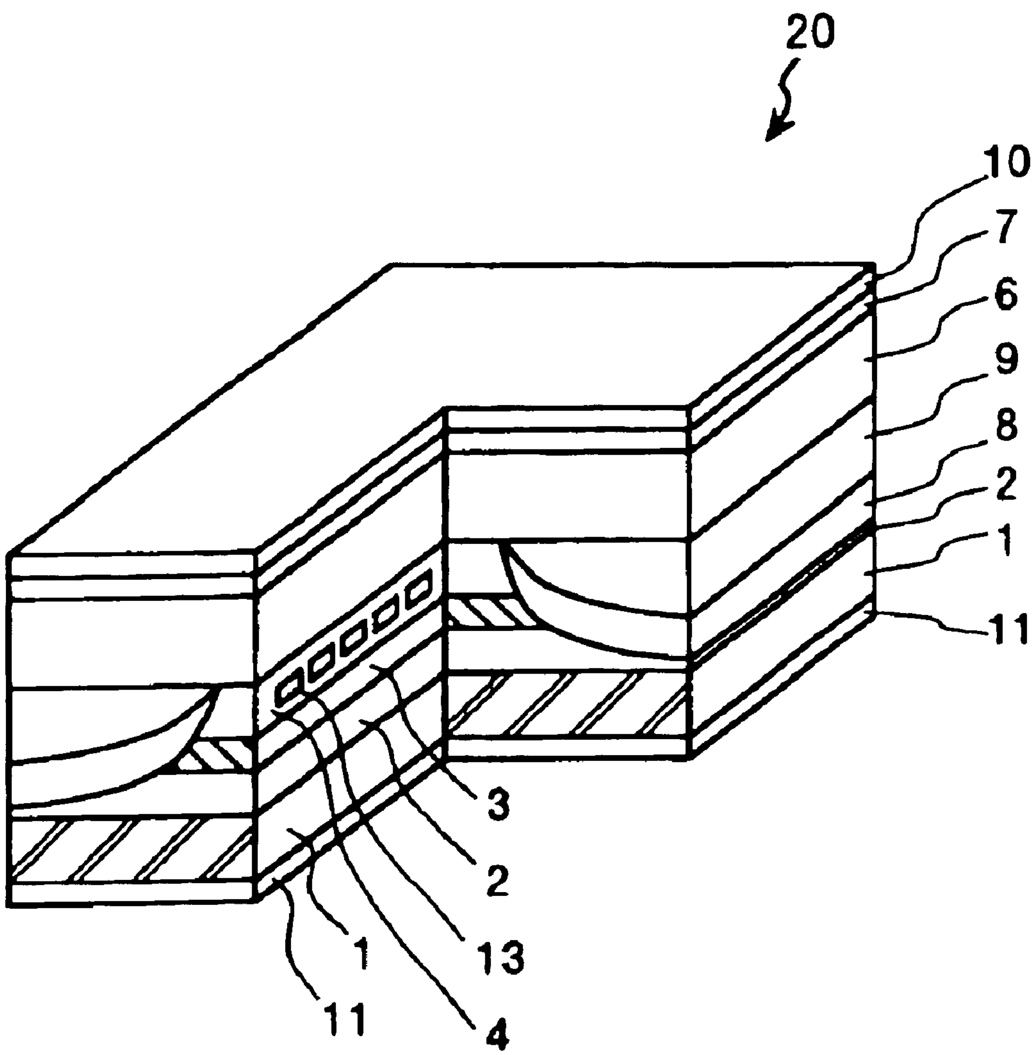
FIG. 1 is a broken perspective view showing a general configuration of a semiconductor laser device according to an embodiment of the present invention.
Figure 2:
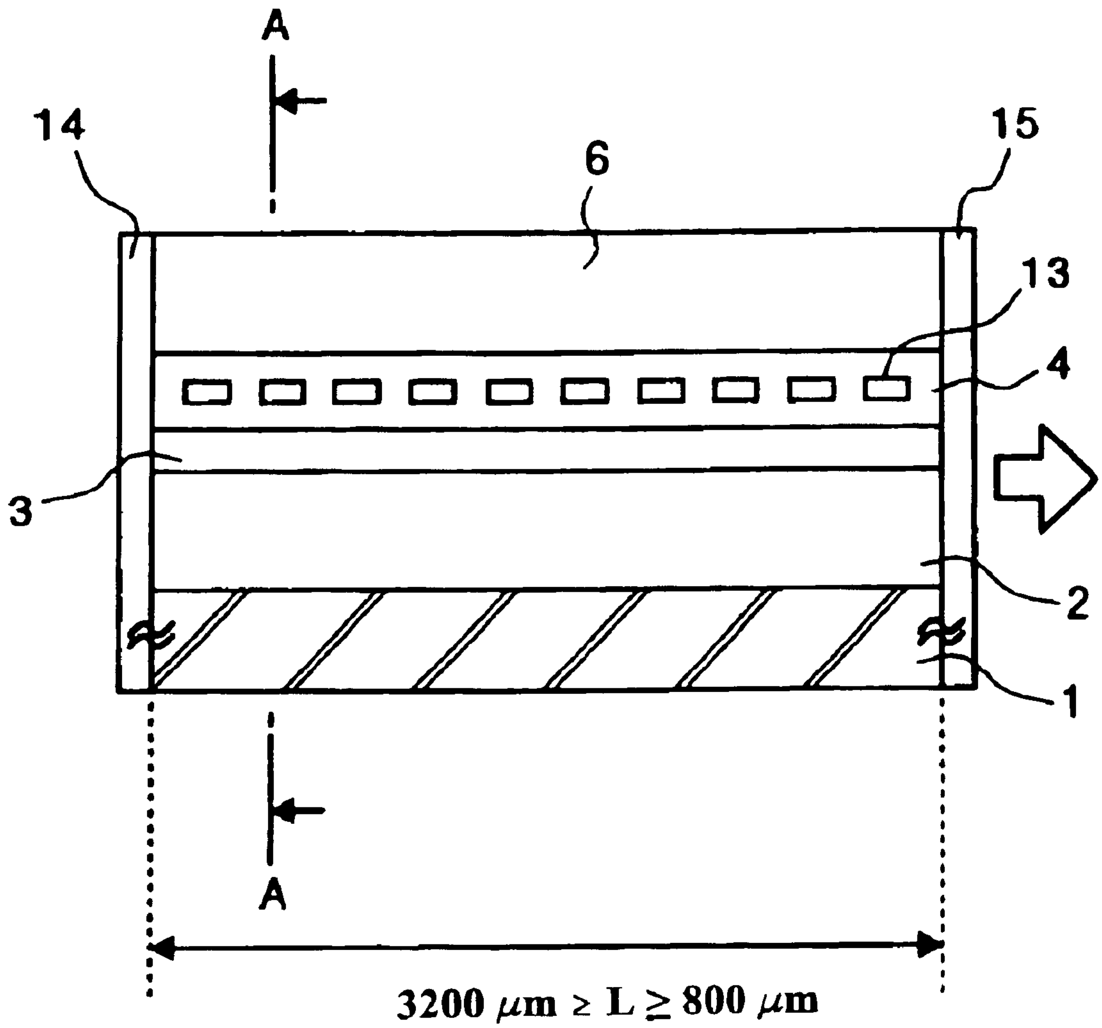
FIG. 2 is a vertical sectional view in the longitudinal direction of the semiconductor laser device shown in FIG. 1.
Figure 3:
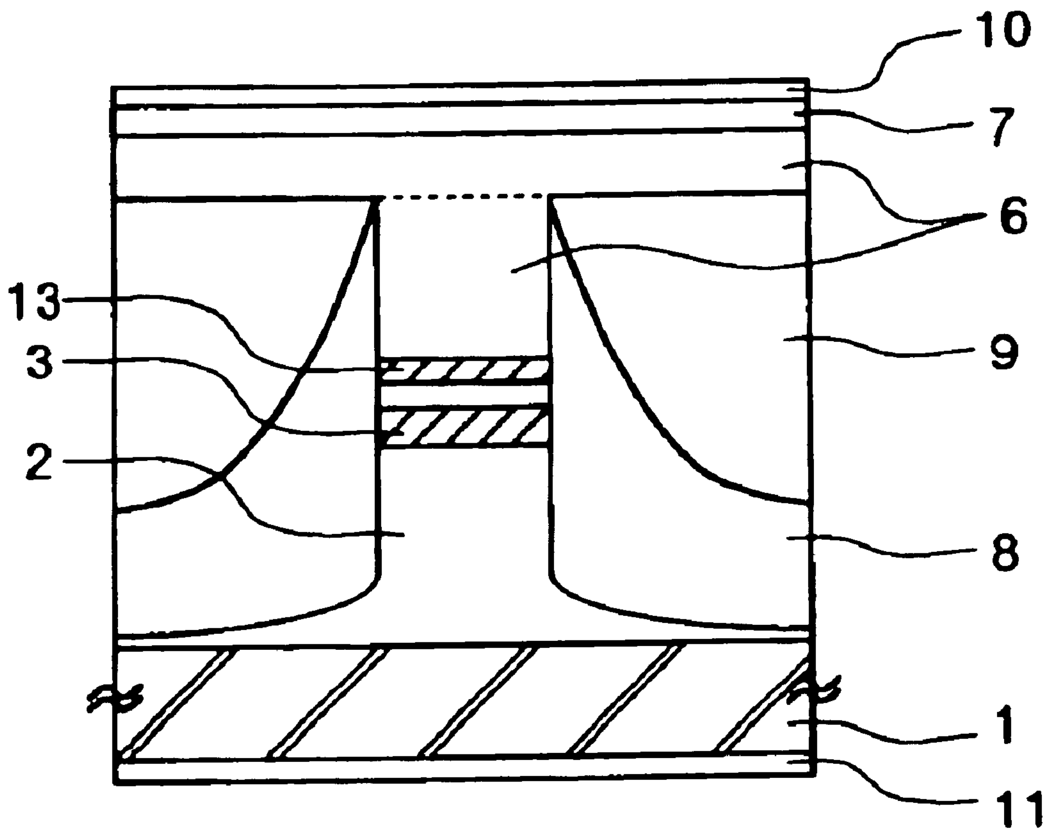
FIG. 3 is a cross sectional view of the semiconductor laser device, taken along the line A—A of the semiconductor laser device shown in FIG. 2.

Referring now to the drawings wherein like elements are represented by the same reference designation throughout, and more particularly to FIGS. 1, 2 and 3 thereof, there is shown a semiconductor laser device for providing a light source suitable for use as a pumping light source in a Raman amplification system in accordance with an embodiment of the present invention. FIG. 1 is a broken perspective view showing a general configuration of a semiconductor laser device according to an embodiment of the present invention. FIG. 2 is a vertical sectional view in the longitudinal direction of the semiconductor laser device shown in FIG. 1, and FIG. 3 is a cross sectional view of the semiconductor laser device, taken along the line A—A in FIG. 2.

The semiconductor laser device 20 of FIGS. 1–3 includes an n-InP substrate 1 having an n-InP buffer layer 2, an active layer 3, a p-InP spacer layer 4, a p-InP cladding layer 6, and an InGaAsP cap layer 7 sequentially stacked on the substrate 1. Buffer layer 2 serves both as a buffer layer by the n-InP material and a under cladding layer, while the active layer 3 is a graded index separate confinement multiple quantum well (GRIN-SCH-MQW). A diffraction grating 13 of a p-InGaAs material is periodically formed within the p-InP spacer layer 4 substantially along the entire length of active layer 3. The diffraction grating 13 of the embodiment of FIG. 1 has a film thickness of 20 nm, a pitch of 220 nm, and selects a laser beam having a central wavelength of 1480 nm, to be emitted by the semiconductor laser device 20.

As best seen in FIG. 3, the p-InP spacer layer 4 having the diffraction grating 13, the GRIN-SCH-MQW active layer 3, and the upper part of the n-InP buffer layer 2 are processed in a mesa strip shape. The sides of the mesa strip are buried by a p-InP blocking layer 8 and an n-InP blocking layer 9 formed as current blocking layers. In addition, a p-side electrode 10 is formed on the upper surface of InGaAsP cap layer 7, and an n-side electrode 11 is formed on the back surface of n-InP substrate 1.

As seen in FIG. 2, reflective film 14 having high reflection factor of, for example, 80% or more is formed on a light reflecting end surface that is one end surface in the longitudinal direction of the semiconductor laser device 20. Antireflection coating 15 having low light reflection factor of, for example, 1% to 5% is formed on a light irradiating end surface opposing the light reflecting end surface of semiconductor laser device 20. The reflective film 14 and the antireflection coating 15 form a light resonator within the active region 3 of the semiconductor laser device 20. As seen in FIG. 2, the resonator has a predetermined length L as will be further described below. A light beam generated inside the GRIN-SCH-MQW active layer 3 of the light resonator is reflected by the reflective film 14 and irradiated as an output laser beam via the antireflection coating 15.

Thus, as seen in the embodiment of FIGS. 1–3, the present invention provides a diffraction grating within the spacer layer 4 of the semiconductor laser device 20. The present inventors have realized that such an integrated diffraction grating contained within the semiconductor laser device provides several advantages over external fiber grating laser modules such as the one described with respect to FIG. 17.

Figure 16:
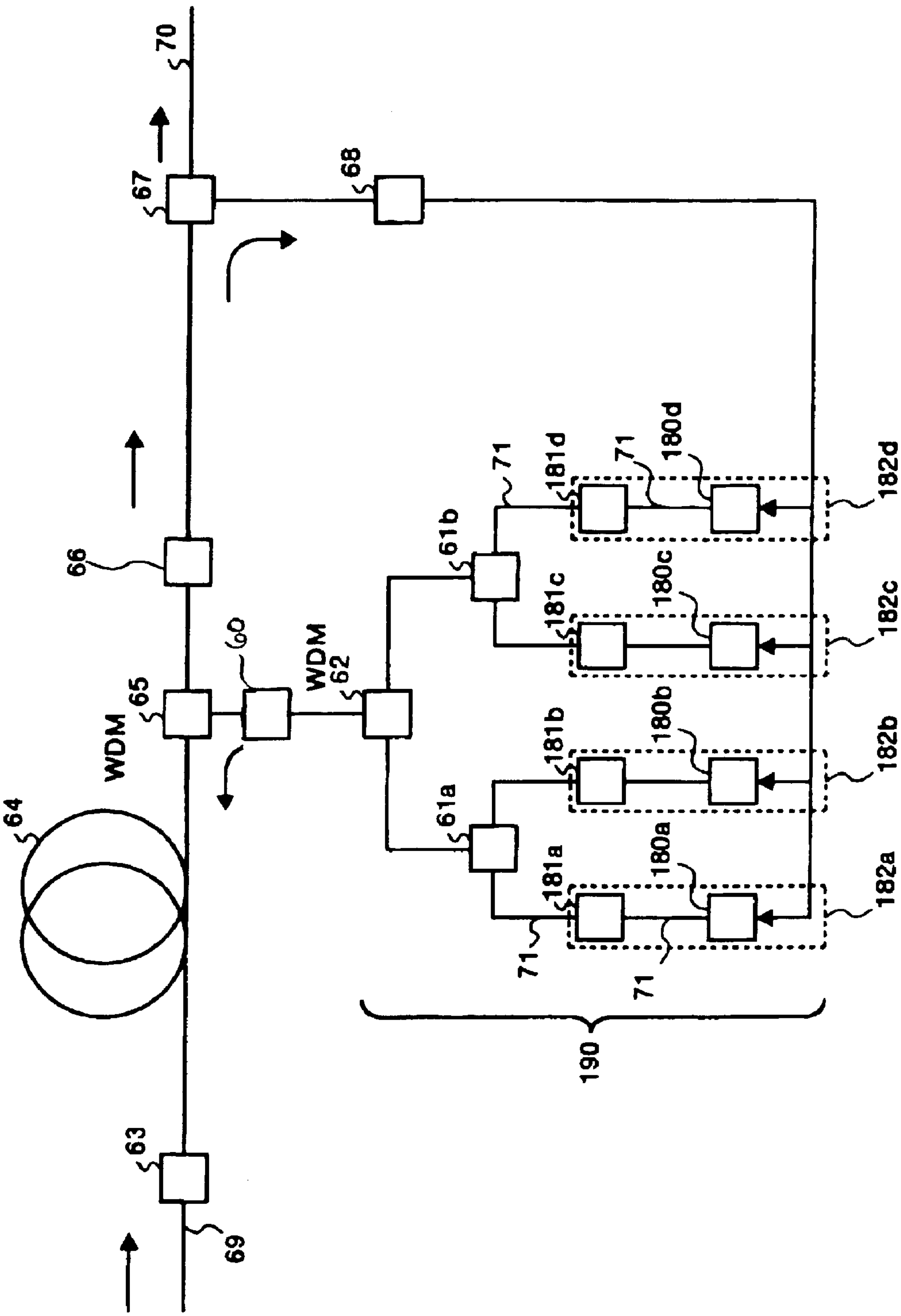
FIG. 16 is a block diagram illustrating a general configuration of a conventional Raman amplifier.
Figure 17:
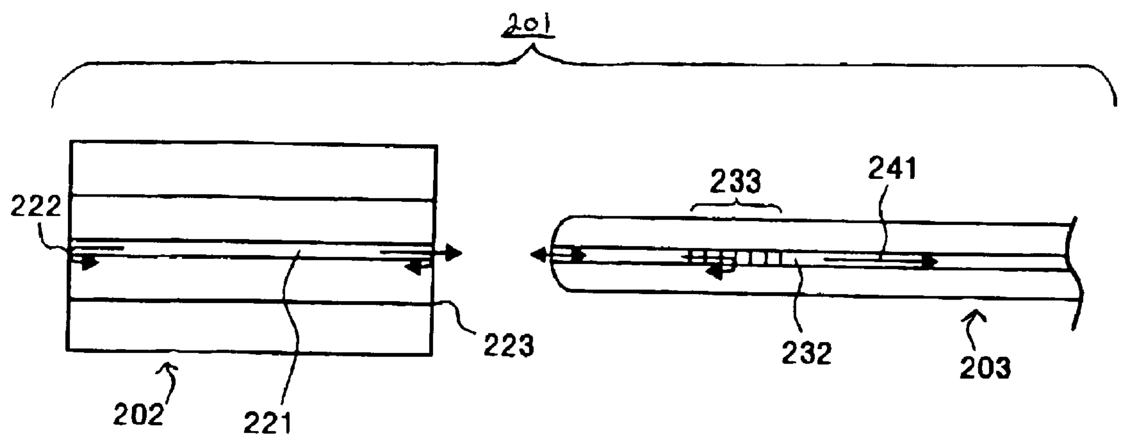
FIG. 17 is a diagram showing a configuration of a semiconductor laser module used in the Raman amplifier shown in FIG. 16.

First, the semiconductor laser module illustrated in FIG. 17 provides a light source with high RIN which is contrary to the requirements of a Raman amplifier as discussed above. Referring again to FIG. 17, the present inventors have discovered that the fiber grating semiconductor laser module 201 (182*a* through 182*d* in FIG. 16) has a large RIN due to resonance between the external fiber grating 233 and the light reflecting surface 222 of the semiconductor laser emitting element 202. That is, due to the long interval between the fiber grating 233 and the semiconductor light-emitting element 202, stable Raman amplification cannot be performed. However, since the semiconductor laser device 20 of the present invention provides a laser beam irradiated from the low reflection coating 15 directly as an excitation light source of the Raman amplifier without using an external fiber grating, the RIN is smaller. As a result, the fluctuation of the Raman gain becomes smaller and a stable Raman amplification can be performed in systems using an integrated diffraction grating semiconductor laser device in accordance with the present invention.

Moreover, because of the low RIN level, the integrated grating semiconductor laser device of the present invention is not constrained to a backward pumping method when used in a Raman amplification system as with fiber grating semiconductor laser modules. Applicants have recognized that the backward pumping method is most frequently used in present fiber grating Raman amplifier systems because the forward pumping method, in which a weak signal light beam advances in the same direction as a strong excited light beam, has a problem in that fluctuation-associated noises of pumping light are easy to be modulated onto the signal. As discussed above, the semiconductor laser device of the present invention provides a stable pumping light source for Raman amplification and therefore can easily be adapted to a forward pumping method.

The mechanical stability problems of the semiconductor laser module illustrated in FIG. 17 are also diminished by the present invention. Since the resonator of the diffraction grating device is not physically separated from the semiconductor laser device but monolithically integrated therein, the semiconductor laser device of this first embodiment does not experience a variation of the oscillating characteristic of a laser caused by mechanical vibration or change in ambient temperature and can acquire a stable light output and Raman gain. Moreover, as the diffraction grating of the present invention is internal to the semiconductor device, the temperature of the grating is controlled by the temperature control unit that provides temperature control for the semiconductor device. This not only eliminates the affects of ambient temperature changes on the oscillation wavelength selected by the grating, but also provides a mechanism for controlling the oscillation wavelength of a multiple mode laser device in accordance with the present invention as will be further described below.

While the integrated diffraction grating device of the present invention provides the above-described advantages over the fiber grating laser module, the primary use of the present invention is as a pumping source for a Raman amplifier. Therefore, the integrated diffraction grating device of the present invention must also provide multiple longitudinal mode operation. Despite the fact that conventional integrated grating devices provided only single mode operation suitable for a signal light source, the present inventors have discovered that multiple mode operation suitable for a pumping light source for Raman amplification can be provided by an integrated diffraction grating device.

Figure 4:
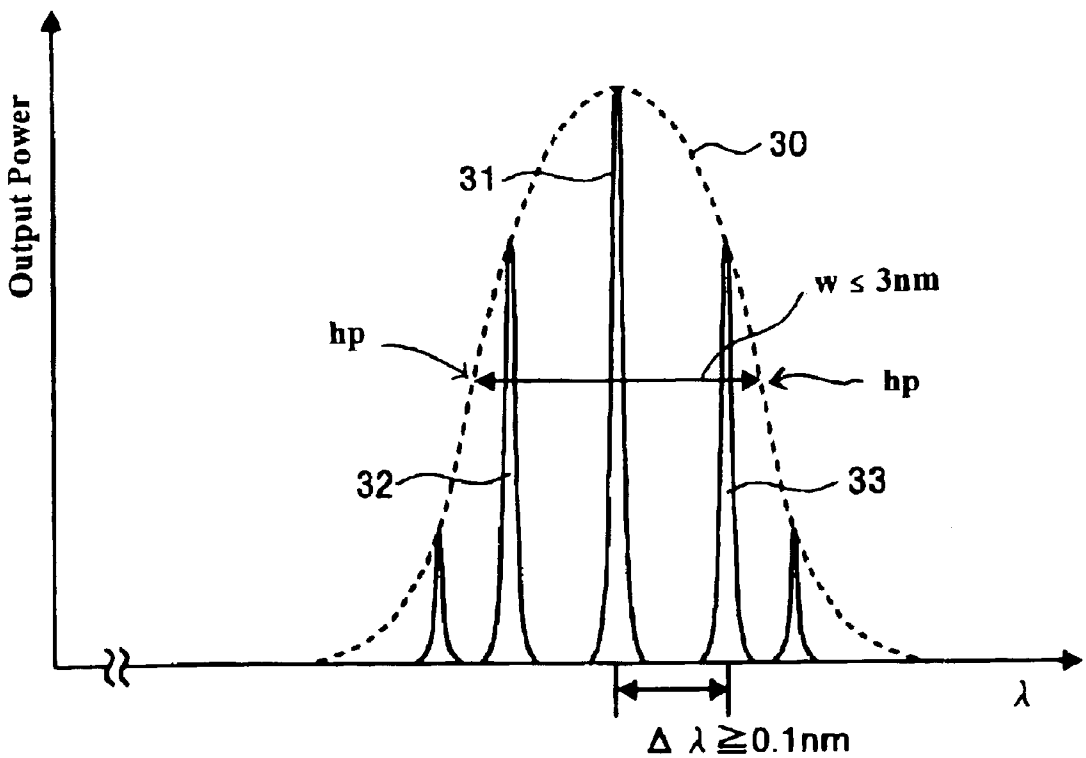
FIG. 4 is a graph showing the multiple oscillation longitudinal mode output characteristics of a diffraction grating semiconductor laser device of the present invention.

FIG. 4 shows the multiple oscillation longitudinal mode output characteristics of a diffraction grating semiconductor laser device of the present invention. As seen in this figure, the oscillation wavelength spectrum 30 provides multiple longitudinal modes, for example 31, 32, and 33, separated by a wavelength interval $\Delta\lambda$. As the integrated diffraction grating of the laser device of the present invention selects a longitudinal mode by its Bragg wavelength, FIG. 4 also shows the predetermined spectral width w of the oscillation spectrum 30 as defined by of half power points hp of the oscillation spectrum. The predetermined spectral width w is a predetermined spectral bandwidth which defines a portion of the wavelength oscillation spectrum that includes the laser operating modes. Thus, while FIG. 4 shows the predetermined spectral width w as the full width at half maximum power (FWHM), it is to be understood that the predetermined spectral width w may be defined by any width on the oscillation spectrum 30. For example, another known way to define the predetermined spectral width is by the 10 db down from maximum power points of the oscillation wavelength spectrum 30. It is clear from this description that the number of laser operating modes may change for a given oscillation wavelength spectrum depending on how the predetermined spectral width w is defined. Thus, as recognized by the present inventors, in order to provide the multiple oscillation longitudinal mode characteristics required to reduce stimulated Brillouin scattering in a Raman amplifier, an integrated diffraction grating laser device of the present invention must provide a plurality of oscillation longitudinal modes within the predetermined spectral width w of the oscillation wavelength spectrum 30.

Figure 13:
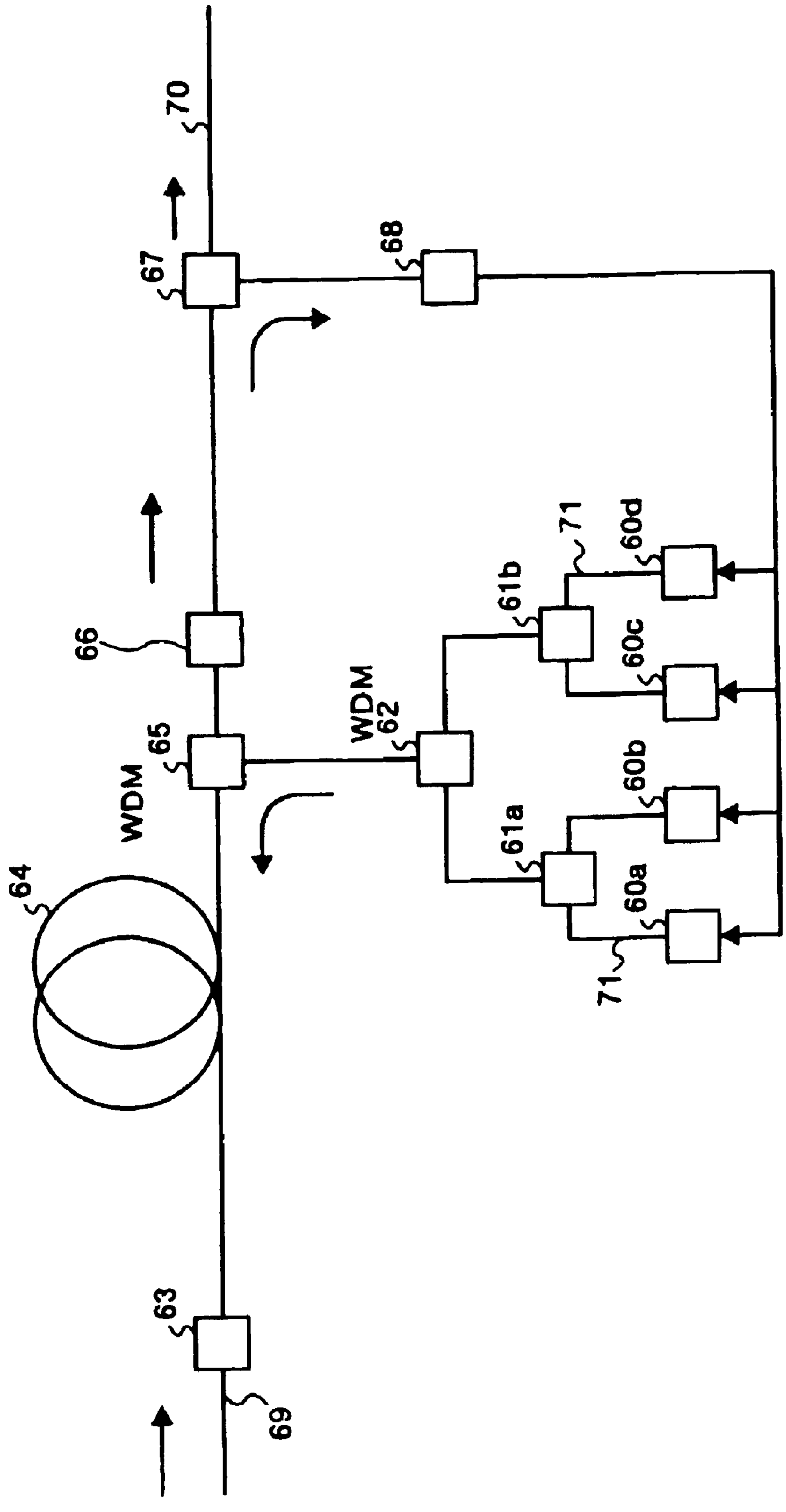
FIG. 13 is a block diagram illustrating a configuration of a Raman amplifier in which polarization dependency is canceled by polarization-multiplexing of pumping light beams output from two semiconductor laser devices, in accordance with an embodiment of the present invention.
Figure 13A:
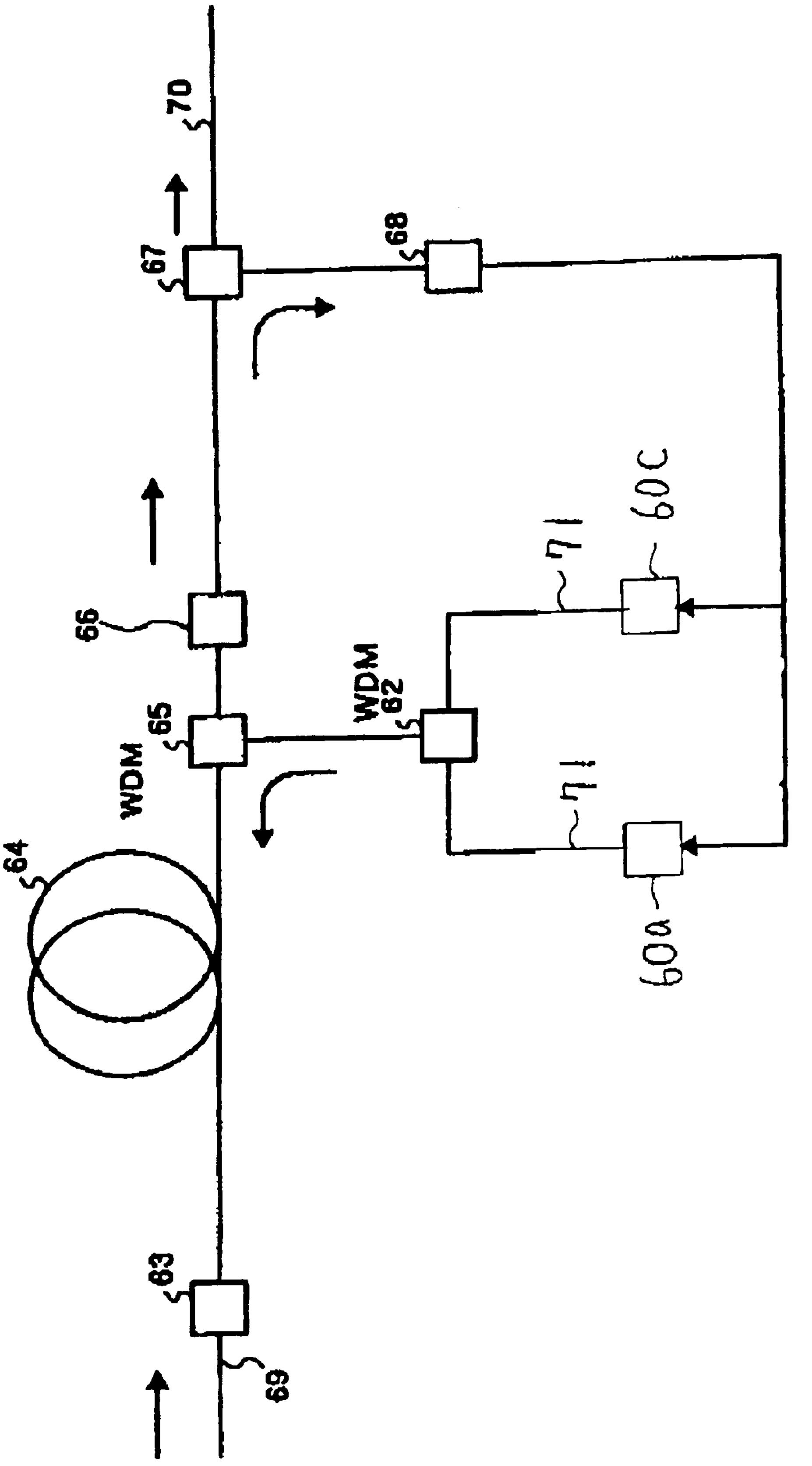
FIG. 13A is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention.

Moreover, the present inventors have recognized that the number of longitudinal modes included in the predetermined spectral width w should be at least three, as shown by modes 31, 32, and 33 of FIG. 4. As discussed above, Raman amplification systems using a forward pumping method presents a problem in the resulting gain is dependent on the polarization of the incident pumping light. This dependency is canceled by performing polarization-multiplexing of pumping light beams output from two of the semiconductor laser devices 20, or by depolarizing a pumping light beam output from a single semiconductor laser device using polarization maintaining fibers as a depolarizer (these alternative embodiments are shown in FIGS. 13 and 13*a* respectively which will be further described below). In the latter case, the angle of the polarization axis of the polarization maintaining fiber against the emitted light from semiconductor laser device is approximately 45 degrees. With this configuration, an output of the laser device having a single polarization can obtain a random polarization by propagating a minimum distance through a polarization maintaining fiber. In general, the more the number of the oscillation longitudinal modes is increased, the shorter the length of the polarization maintaining fiber can be. Particularly, when the number of the oscillation longitudinal modes is more than three, preferably four or five, the coherence length of the laser light becomes shorter and the length of polarization maintaining fiber necessary for depolarizing the laser light becomes markedly short. Thus, it becomes easier to obtain a laser light of low degree of polarization (DOP) which is spectral for reducing the polarization dependency of a Raman amplifier, making it more feasible to replace 2 laser modules which are polarization-multiplexed with a single laser module with higher power and to thereby reduce the cost of lasers as well as polarization maintaining fibers.

In order to achieve the desired plurality of oscillation modes within the predetermined spectral width of the oscillation profile, the present inventors have recognized that the predetermined spectral width w and/or the wavelength interval $\Delta\lambda$ may be manipulated. However, a Raman amplification system poses limits on the values of the wavelength interval $\Delta\lambda$ and predetermined spectral width w of the oscillation wavelength spectrum 30. With regard to the wavelength interval $\Delta\lambda$, the present inventors have determined that this value should 0.1 nm or more as shown in FIG. 4. This is because, in a case in which the semiconductor laser device 20 is used as a pumping light source of the Raman amplifier, if the wavelength interval $\Delta\lambda$ is 0.1 nm or more, it is unlikely that the stimulated Brillouin scattering is generated. With regard to the predetermined spectral width w of the oscillation wavelength profile 30, if the predetermined spectral width of the oscillation wavelength is too wide, the coupling loss by a wavelength-multiplexing coupler becomes larger. Moreover, a noise and a gain variation are generated due to the fluctuation of the wavelength within the spectrum width of the oscillation wavelength. Therefore, the present inventors have determined that the predetermined spectral width w of the oscillation wavelength spectrum 30 should be 3 nm or less as shown in FIG. 4, and is preferably 2 nm or less.

In general, a wavelength interval $\Delta\lambda$ of the longitudinal modes generated by a resonator of a semiconductor device can be represented by the following equation:

$$\Delta\lambda=\lambda_0^2/(2\cdot n\cdot L),$$

where n is the effective refractive index, $\lambda_0$ is the oscillation wavelength, and L is a length of the resonator defined by the reflection coating 14 and antireflection coating 15 as discussed with respect to FIGS. 1–3 above. From this equation it is seen that, neglecting refractive index n which has only a marginal affect on $\Delta\lambda$, the longer the resonator length is, the narrower the wavelength interval $\Delta\lambda$ becomes, and selection conditions for oscillating a laser beam of the signal longitudinal mode becomes stricter. However, in order to provide the desired plurality of longitudinal modes within a predetermined spectral width w of 3 nm or less, the resonator length L cannot be made too short. For example, in the diffraction grating device of FIGS. 1–3 where the oscillation wavelength $\lambda_0$ is 1480 nm and the effective refractive index is 3.5, the wavelength interval $\Delta\lambda$ of the longitudinal mode is approximately 0.39 nm when the resonator length is 800 $\mu$m. When the resonator length is 800 $\mu$m or more, it is easy to obtain a plurality of operating modes and higher output power. However, the resonator length L must not be made so long that the required wavelength interval of 0.1 nm cannot be achieved. Returning to the example of FIGS. 1–3 when the resonator length is 3200 $\mu$m, the wavelength interval $\Delta\lambda$ of the longitudinal mode is approximately 0.1 nm.

Thus, for a semiconductor laser device having an oscillation wavelength $\lambda_0$ of 1480 nm and an effective refractive index of 3.5, the resonator cavity length L must approximately within the range of 800 to 3200 $\mu$m as indicated in FIG. 2. It is noted that an integrated diffraction grating semiconductor laser device having such a resonator length L was not used in the conventional semiconductor laser devices because single longitudinal mode oscillation is difficult when the resonator length L is 800 $\mu$m or more. However, the semiconductor laser device 20 of the present invention, is intentionally made to provide a laser output with a plurality of oscillation longitudinal modes included within the predetermined spectral width w of the oscillation wavelength spectrum by actively making the resonator length L 800 $\mu$m or more. In addition, a laser diode with such a long resonator length is suitable to get high output power.

According to another embodiment of the present invention, the objective of providing a plurality of operating modes within a predetermined spectral width w of the oscillation profile 30 is achieved by widening the predetermined spectral width w of the oscillation profile 30. In this embodiment, the predetermined spectral width w of the oscillation wavelength spectrum 30 is varied by changing a coupling coefficient K and/or a grating length Lg of the diffraction grating. Specifically, assuming a fixed multiplication coupling coefficient K*Lg (hereinafter "coupling coefficient") and a predetermined spectral width w defined by the FWHM points, where the grating length Lg of the resonator is decreased, the predetermined spectral width w is increased thereby allowing a greater number of longitudinal modes to occupy the predetermined spectral width w as laser operating modes. In this regard, it is noted that conventional integrated grating devices used only a full length grating structure. This is because these conventional devices provided only single mode operation in which it was undesirable to increase predetermined spectral width. The present inventors have discovered that shortening the grating is useful in providing multiple mode operation. In this way, the influence of the Fabry-Pérot type resonator formed by the reflection coating 14 and the antireflection coating 15 can be smaller while widening the predetermined spectral width w in accordance with the present invention.

Figure 5:
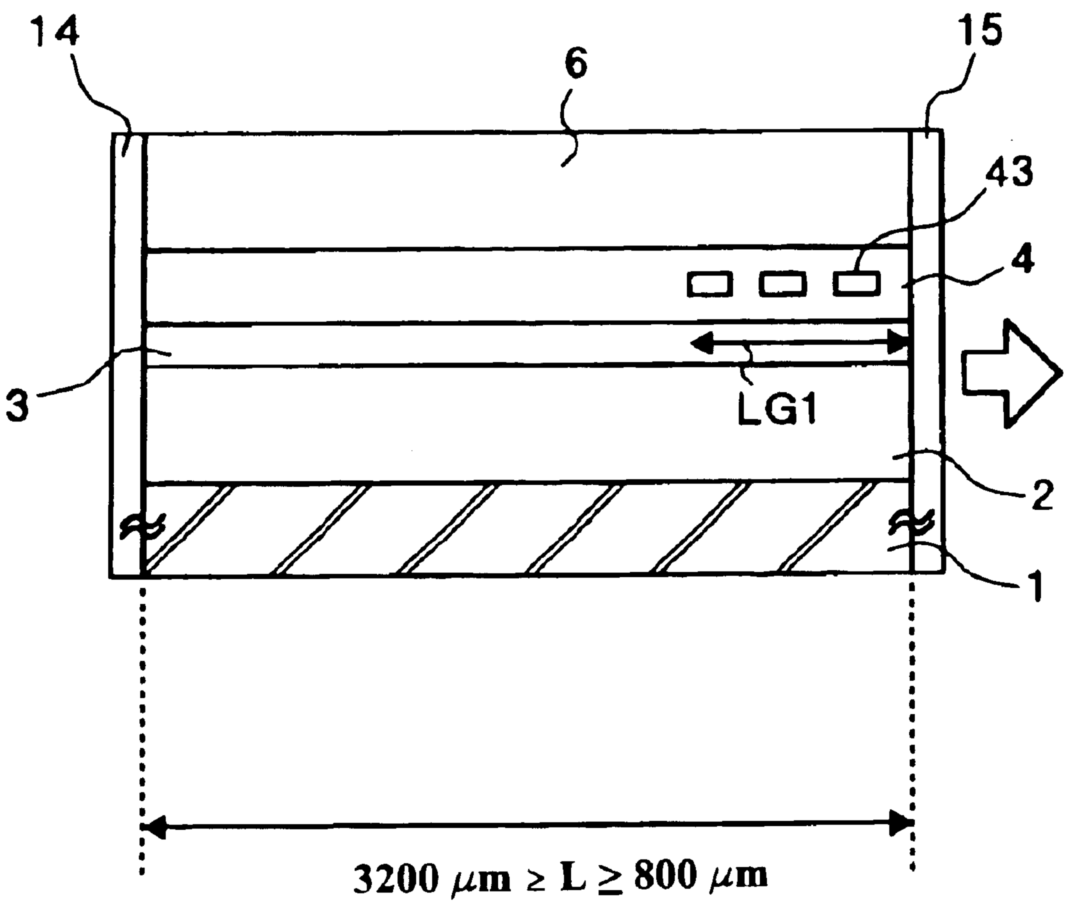
FIG. 5 is a vertical sectional view in the longitudinal direction illustrating a semiconductor laser device having a shortened diffraction grating in the vicinity of an antireflection coating in according to an embodiment of the present invention.

FIG. 5 is a vertical sectional view in the longitudinal direction illustrating a general configuration of a semiconductor laser device according to an embodiment of the present invention. The semiconductor laser device shown in FIG. 5 has an oscillation wavelength of 980–1550 nm, preferably 1480 nm, and has a similar configuration as that of FIGS. 1–3 with the exception of the shortened diffraction grating 43 and the reflective properties of the reflection coating 14 and the antireflection coating 15. Diffraction grating 43 is a shortened grating positioned a predetermined length Lg1 from the antireflection coating 15. In this regard, the present inventors have discovered that if the diffraction grating 43 is formed substantially in the region of the antireflection coating 15, an ultra-low light reflecting coating should be applied as the antireflection coating 15 and a high light reflecting coating applied as the reflection coating 14. Thus, the reflection coating 14 and the antireflection coating 15 of FIG. 5 preferably have a reflectivity of 80% or more, and 2% or less respectively. Moreover where the diffraction grating is formed in the antireflection coating 15 side as in FIG. 5, it is preferable to set the reflectivity of the diffraction grating 43 itself rather low; therefore, the coupling coefficient K*Lg is preferably set to 0.3 or less, and more preferably set to 0.1 or less.

Figure 5A:
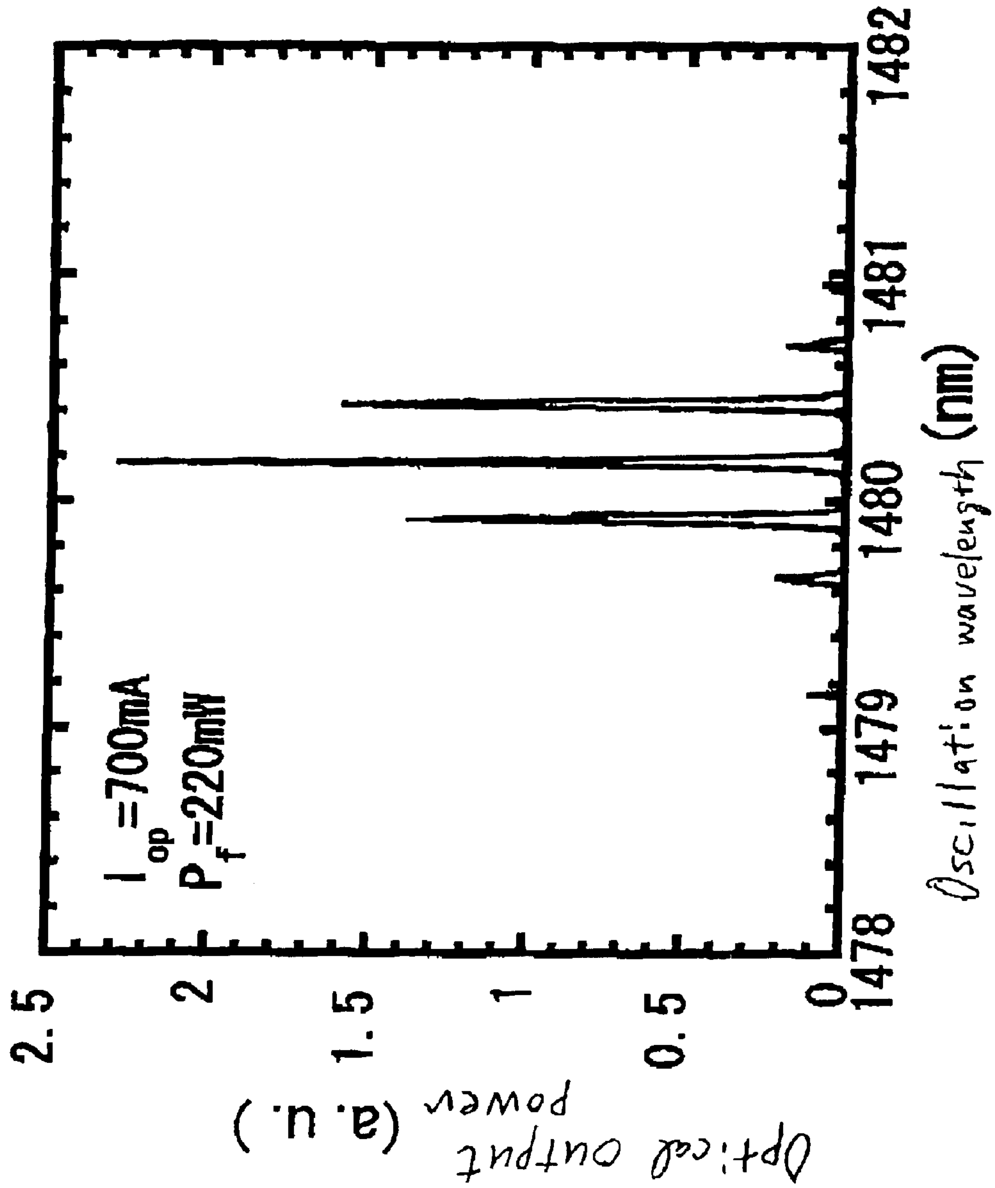
FIG. 5A is a graph showing the optical output power of a semiconductor laser device, as a function of oscillation wavelength, in accordance with an embodiment of the present invention.

As a specific example of the of the diffraction grating semiconductor laser device illustrated in FIG. 5, a resonator length L may be set to 1300 $\mu$m and the grating length of the diffraction grating 43 to 100 $\mu$m with a coupling coefficient K*Lg of 0.1. With a front facet 15 reflectivity of 0.1% and a rear facet 14 reflectivity of 97%, a predetermined spectral width of the oscillation wavelength spectrum 30 is 0.5 to 0.6 nm and 3 oscillation modes can be included in the predetermined spectral width. FIG. 5A is a graph showing the optical output power of such a semiconductor laser device as a function of oscillation wavelength. This laser device was also shown to have a RIN of under −140 db/Hz at about 10 GHz and a driving current of over 300 mA.

Figure 6:
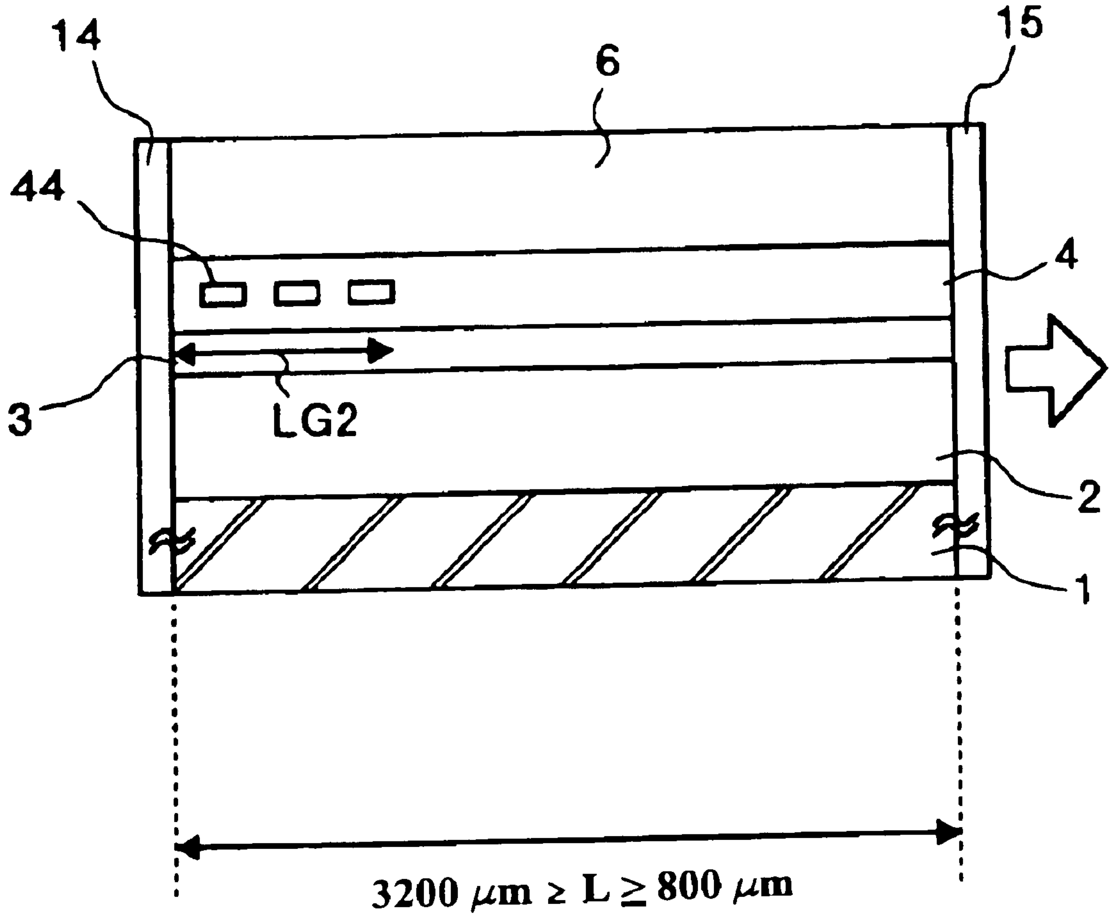
FIG. 6 is a vertical sectional view in the longitudinal direction illustrating a semiconductor laser device having a shortened diffraction grating in the vicinity of a reflection coating in according to an embodiment of the present invention.

FIG. 6 is a vertical sectional view in the longitudinal direction showing an integrated diffraction grating 44 provided in the reflection coating 14 side (i.e., rear facet) instead of the diffraction grating 43 illustrated in FIG. 5. The present inventors have determined that if the diffraction grating 44 is formed substantially in the region of the reflection coating 14, an ultra-low light reflecting coating having the reflectivity of 1% to 5%, or more preferably 0.1 to 2% should be applied as the antireflection coating 15 as with the embodiment of FIG. 5. However, unlike the laser device of FIG. 5, the reflection coating 14 in FIG. 6 has a low light reflectivity of 1 to 5% preferably 0.1% to 2%, and more preferably 0.1% or less. Moreover where the diffraction grating is formed in the reflection coating 15 side as in FIG. 6, it is preferable to set the reflectivity of the diffraction grating 44 itself rather high; thus, the K*Lg is preferably set at 1 or more.

Figure 7:
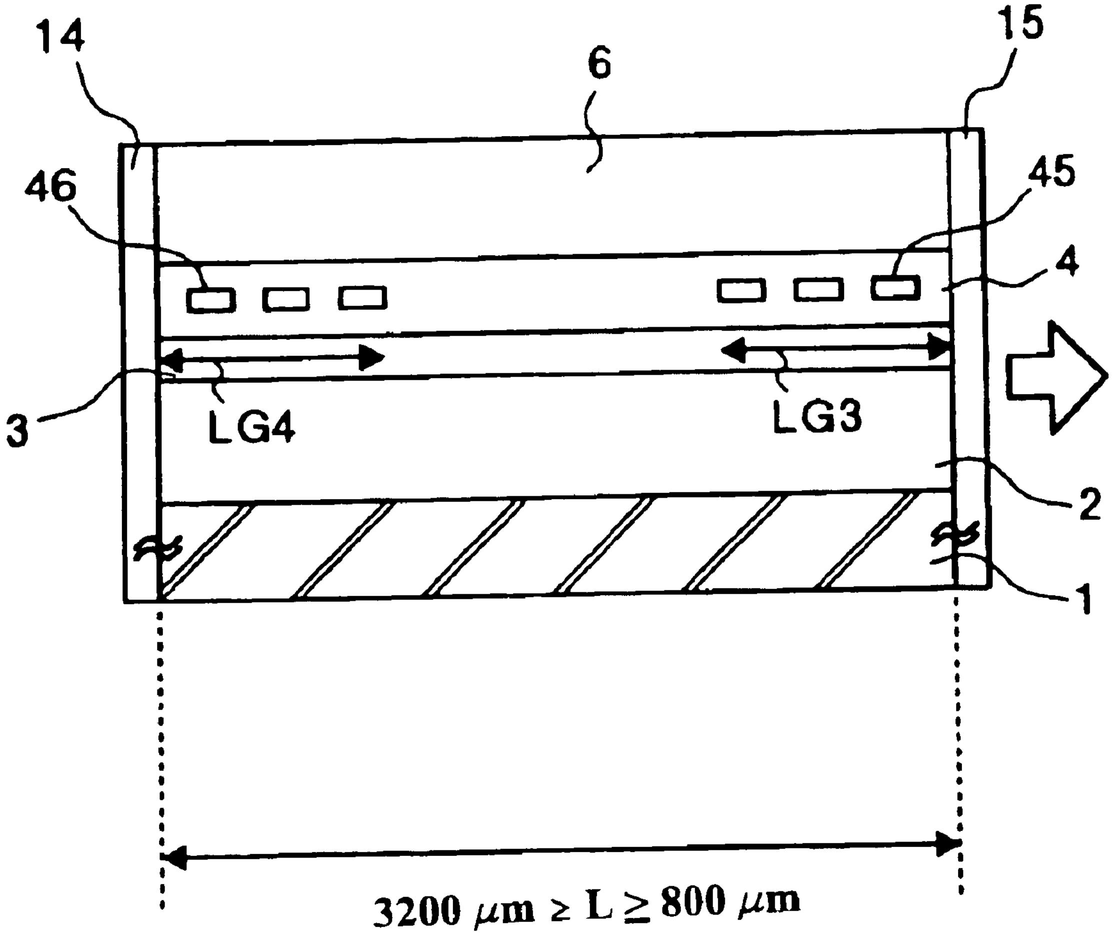
FIG. 7 is a vertical sectional view in the longitudinal direction illustrating a semiconductor laser device having a first shortened diffraction grating in the vicinity of a an antireflection coating and a second shortened diffraction grating in the vicinity of reflection coating in according to an embodiment of the present invention.

FIG. 7 is a vertical sectional view in the longitudinal direction illustrating a configuration of a semiconductor laser device combining the structures of FIGS. 5 and 6. That is, the semiconductor laser device has a diffraction grating 45 formed a predetermined length Lg3 from the antireflective coating 15 which has an ultra-low light reflectivity of 0.1% to 2%, preferably 0.1% or less and a diffraction grating 46 formed a predetermined length Lg4 from the reflection coating 14 which also has the ultra-low light reflectivity of 0.1 to 2%, preferably 0.1% or less. Moreover, since the diffraction gratings 45 and 46 are formed in the antireflective coating 15 side and the reflection coating 14 side respectively, the reflectivity of the diffraction grating 45 itself is set rather low, and the reflectivity of the diffraction grating 46 itself is set rather high. More specifically, the K*Lg of the front facet is 0.3 or less and the K*Lg of the rear facet is 1 or more.

Thus, as illustrated in FIGS. 5–7, shortening of the diffraction grating of a semiconductor laser device widens the predetermined spectral width w of the oscillation wavelength spectrum thereby allowing the semiconductor laser device to provide the desired multiple longitudinal modes for Raman amplification even if the wavelength interval $\Delta\lambda$ is fixed. Moreover, while FIGS. 5 through 7 show diffraction gratings 43 through 46 provided in the antireflective coating 15 side and/or the reflection coating 14 side, it is to be understood that the diffraction gratings are not limited to these configurations, and a diffraction grating having a partial length with respect to the resonator length L may be formed at any position along the GRIN-SCH-MQW active layer 3 as long as consideration is given to the reflectivity of the diffraction grating and reflecting and antireflective coatings.

In each of the embodiments previously described, the diffraction grating has a constant grating period. In yet another embodiment of the present invention, the predetermined spectral width w of the oscillation profile 30 is manipulated by varying the pitch of the diffraction grating. Specifically, the present inventors have realized that the wavelength oscillation profile 30 is shifted toward a longer wavelength where the width of the grating elements (i.e. the grating pitch) is increased. Similarly, the wavelength oscillation profile 30 is shifted toward a shorter wavelength where the grating pitch is decreased. Based on this realization, the present inventors have discovered that a chirped diffraction grating, wherein the grating period of the diffraction grating 13 is periodically changed, provides at least two oscillation profiles by the same laser device. These two oscillation profiles combine to provide a composite profile having a relatively wide predetermined spectral width w thereby effectively increasing the number of longitudinal modes within the predetermined spectral width w.

Figure 8:
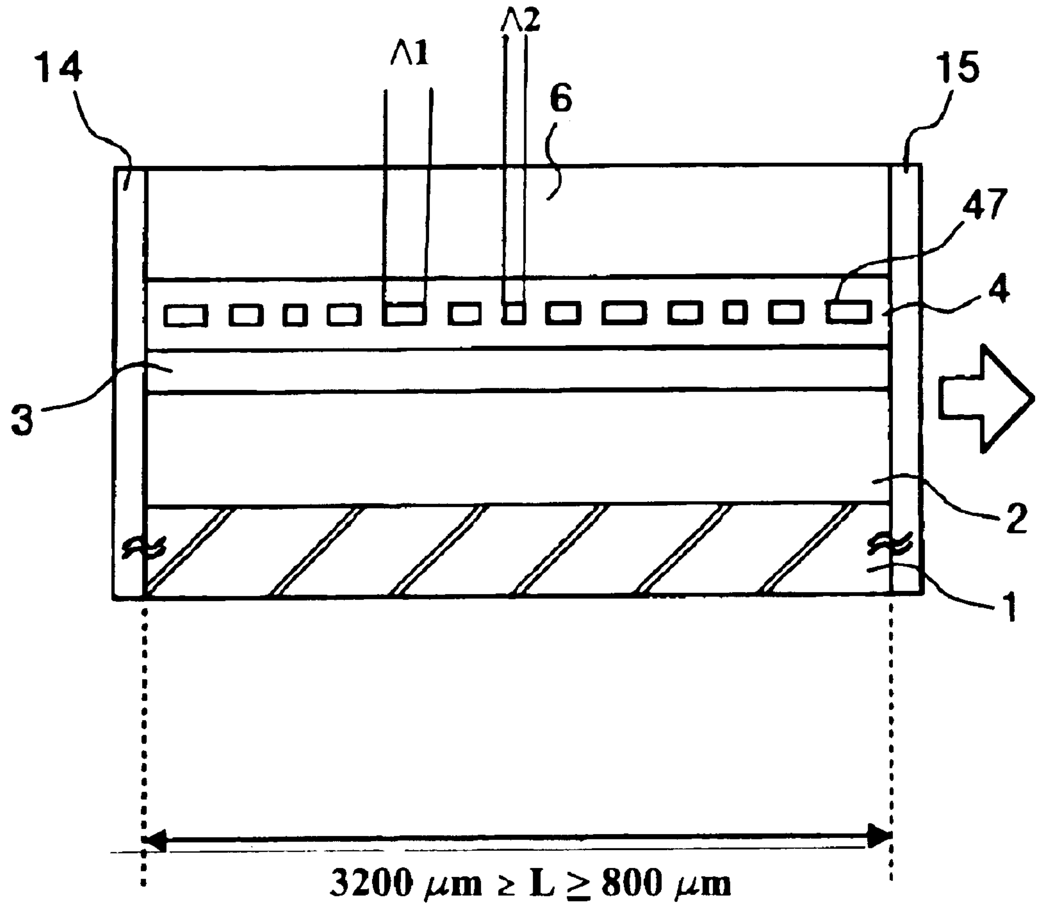
FIG. 8 is a vertical sectional view in the longitudinal direction illustrating a general configuration of a semiconductor laser device having a chirped diffraction grating in accordance with an embodiment of the present invention.
Figure 9:
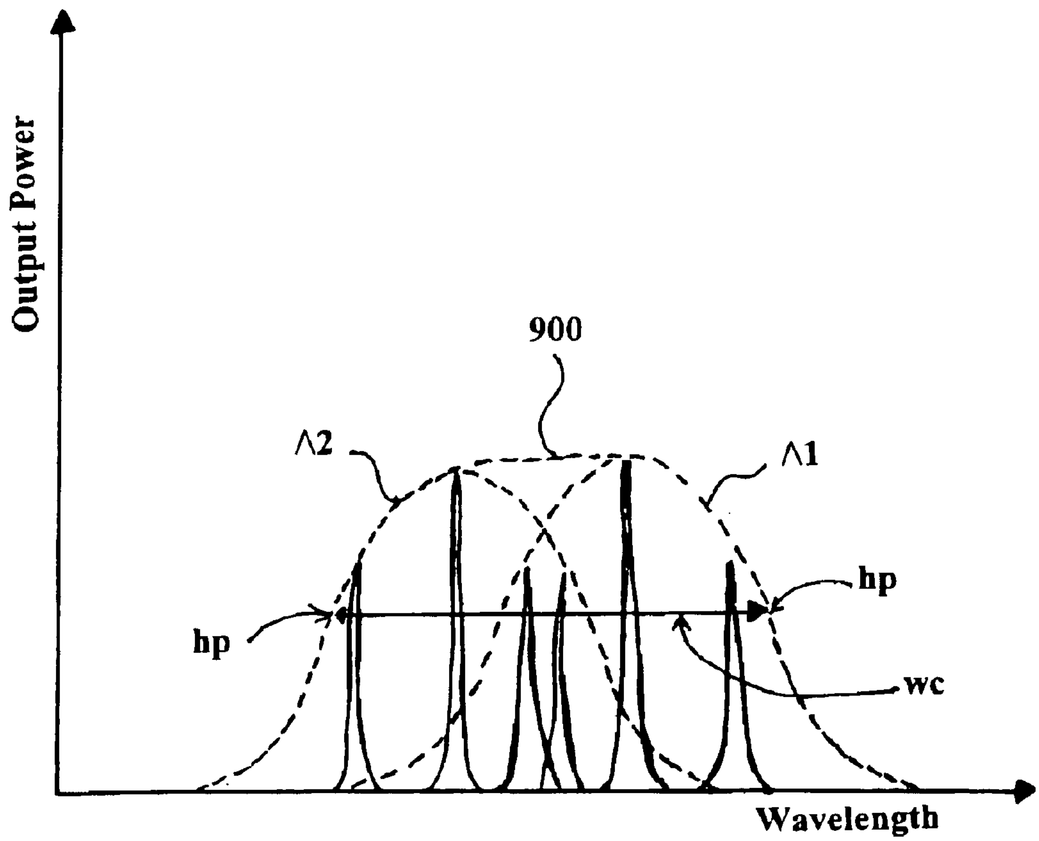
FIG. 9 is a graph illustrating the principle of a composite oscillation wavelength spectrum produced by the combined period $\Lambda_1$ and $\Lambda_2$ of FIG. 8.

FIG. 8 is a vertical sectional view in the longitudinal direction illustrating a general configuration of a semiconductor laser device having a chirped diffraction grating. As seen in this Figure, diffraction grating 47 is made to include at least two grating periods $\Lambda_1$ and $\Lambda_2$. FIG. 9 is a graph illustrating the principle of a composite oscillation wavelength spectrum produced by the combined period $\Lambda_1$ and $\Lambda_2$ of FIG. 8. As seen in FIG. 9, an oscillation wavelength spectrum corresponding to $\Lambda_1$ is produced at a longer wavelength than the oscillation wavelength spectrum corresponding to $\Lambda_2$ since the pitch $\Lambda_1$ is larger than $\Lambda_2$. Where these individual oscillation wavelength spectrums are made to overlap such that a short wavelength half power point of the spectrum of $\Lambda_1$ is at a shorter wavelength than a long wavelength half power point of the spectrum of $\Lambda_2$, a composite oscillation wavelength spectrum 900 is formed as shown in FIG. 9. This composite spectrum 900 defines a composite spectrum width of to thereby effectively widen the predetermined spectral width of wavelength oscillation spectrum to include a larger number of oscillation longitudinal modes.

Figure 10:
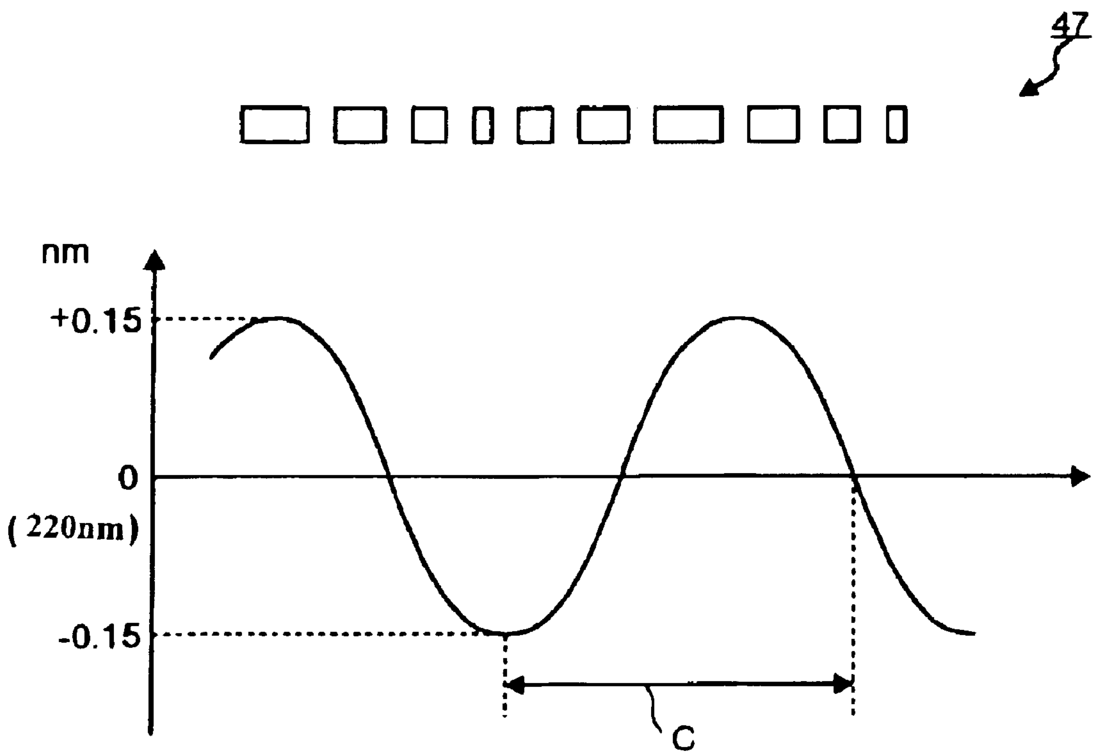
FIG. 10 illustrates a periodic fluctuation of the grating period of a chirped diffraction grating in accordance with the present invention.

FIG. 10 illustrates a periodic fluctuation of the grating period of the diffraction grating 47. As shown in FIG. 10, the diffraction grating 47 has a structure in which the average period is 220 nm and the periodic fluctuation (deviation) of ±0.15 nm is repeated in the period C. In this example, the reflection band of the diffraction grating 47 has the half-width of approximately 2 nm by this periodic fluctuation of ±0.15 nm, thereby enabling three to six oscillation longitudinal modes to be included within the composite width wc of the composite oscillation wavelength spectrum.

Figure 11:
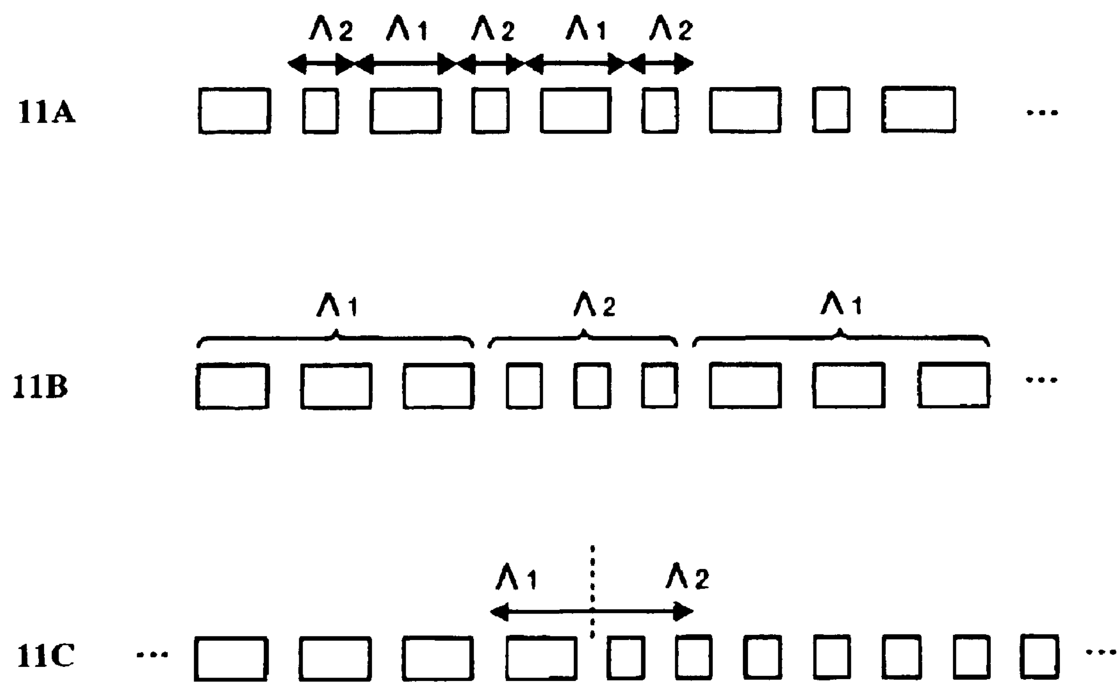
FIGS. 11A through 11C illustrate examples for realizing the periodic fluctuation of the diffraction grating in accordance with the present invention.

Although the chirped grating is the one in which the grating period is changed in the fixed period C in the above-mentioned embodiment, configuration of the present invention is not limited to this, and the grating period may be randomly changed between a period $\Lambda_1$ (220 nm+0.15 mn) and a period $\Lambda_2$ (220 nm−0.15 nm). Moreover, as shown in FIG. 11A, the diffraction grating may be made to repeat the period $\Lambda_1$ and the period $\Lambda_2$ alternately and may be given fluctuation. In addition, as shown in FIG. 11B, the diffraction grating may be made to alternatively repeat the period $\Lambda_1$ and the period $\Lambda_2$ for a plurality of times respectively and may be given fluctuation. As shown in FIG. 11C, the diffraction grating may be made to have a plurality of successive periods $\Lambda_1$ and a plurality of successive periods $\Lambda_2$ and may be given fluctuation. Further, the diffraction grating may be disposed by supplementing a period having a discrete different value between the period $\Lambda_1$ and the period $\Lambda_2$.

Thus, as illustrated by FIGS. 8–11, by giving the diffraction grating provided in the semiconductor laser device a periodic fluctuation of plus or minus a few run with respect to an average period through the chirped grating, the predetermined spectral width of a composite oscillation wavelength spectrum wc can be set to a desired value. Therefore, an output laser beam with a plurality of oscillation longitudinal modes within the predetermined spectral width can be provided by a semiconductor laser device of this embodiment. Moreover, although the chirped grating of the above-described embodiments is set substantially equal to the resonator length L, it is to be understood that the configuration of the present invention is not limited to this and the chirped grating may be formed along a portion of the resonator L (i.e. the active layer) as previously described.

Figure 12:
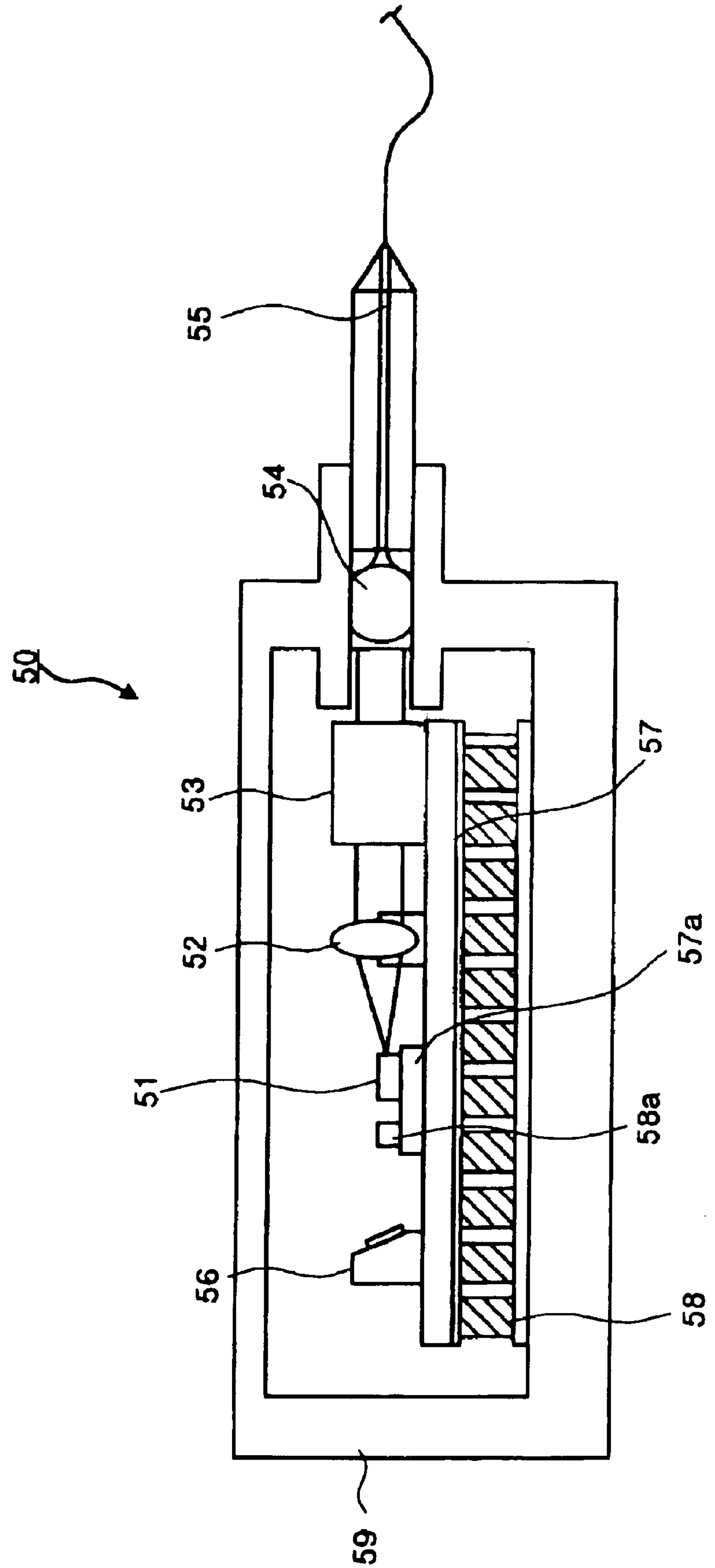
FIG. 12 is a vertical sectional view illustrating a configuration of a semiconductor laser module in accordance with the present invention.

FIG. 12 is a vertical sectional view illustrating the configuration of a semiconductor laser module having a semiconductor laser device according to the present invention. The semiconductor laser module 50 includes a semiconductor laser device 51, a first lens 52, an internal isolator 53, a second lens 54 and an optical fiber 55. Semiconductor laser device 51 is an integrated grating device configured in accordance with any of the above-described semiconductor laser devices and a laser beam irradiated from the semiconductor laser device 51 is guided to optical fiber 55 via first lens 52, internal isolator 53, and second lens 54. The second lens 54 is provided on the optical axis of the laser beam and is optically coupled with the optical fiber 55.

The present inventors have recognized that, in the semiconductor laser module 50 having the semiconductor laser device 51 of the present invention, since the diffraction grating is formed inside the semiconductor laser device 51, internal isolator 53 can be intervened between the semiconductor laser device 51 and the optical fiber 55. This provides an advantage in that reflected return light beams by other optical parts or from the external of the semiconductor laser nodule 50 are not re-inputted in the resonator of the laser device 51. Thus, the oscillation of the semiconductor laser device 51 can be stable even in the presence of reflection from outside. Moreover, placing the internal isolator 53 between the laser device 51 and optical fiber 55 does not introduce loss to the laser module. As is known in the art, the loss of an isolator is primarily in the area of a collecting lens which focuses the light beam onto a fiber at the output of the isolator material. The loss is caused by the coupling between this output lens and an output optical fiber. However, by using an internal isolator 53, the second lens 54 of the laser module 50 provides the function of the output lens of the isolator. Since the second lens 54 is necessary to the laser module 50 even without the internal isolator, the internal isolator 53 does not introduce any power loss into the laser module 50. In fact, use of the internal isolator reduces the loss of Raman amplifier system as will be further described below. Another advantage provided by the Internal isolator 53 is that it provides stable isolation characteristics. More specifically, since internal isolator 53 is in contact with the Peltier module 58, the internal isolator 53 is held at a constant temperature and therefore does not have the fluctuating isolation characteristics of an external isolator which is typically at ambient temperature.

A back face monitor photo diode 56 is disposed on a base 57 which functions as a heat sink and is attached to a temperature control device 58 mounted on the metal package 59 of the laser module 50. The back face monitor photo diode 56 detects a light leakage from the reflection coating side of the semiconductor laser device 51. The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can improved. Alternatively, a thermistor 58*a* can be used to control the characteristics of the laser device. If the temperature of the laser device measured by a thermistor 58*a* located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power intensity of the semiconductor laser device are stabilized.

Yet another advantage of the laser module 50 using the integrated laser device according to the present invention 15 that the Peltier module can be used to control the oscillation wavelength of the laser device. As described above, the wavelength selection characteristic of a diffraction grating is dependant on temperature, with the diffraction grating integrated in the semiconductor laser device in accordance with the present invention, the Peltier module 58 can be used to actively control the temperature of the grating and, therefore, the oscillation wavelength of the laser device.

FIG. 13 is a block diagram illustrating a configuration of a Raman amplifier used in a WDM communication system in accordance with the present invention. In FIG. 13, semiconductor laser modules 60*a* through 60*d* are of the type described in the embodiment of FIG. 12. The laser modules 60*a* and 60*b* output laser beams having the same wavelength via polarization maintaining fiber 71 to polarization-multiplexing coupler. Similarly, laser beams outputted by each of the semiconductor laser modules 60*c* and 60*d* have the same wavelength, and they are polarization-multiplexed by the polarization-multiplexing coupler 61*b*. Each of the laser modules 60*a* through 60*d* outputs a laser beam having a plurality of oscillation longitudinal modes in accordance with the present invention to a respective polarization-multiplexing coupler 61*a* and 61*b* via a polarization maintaining fiber 71.

Polarization-multiplexing couplers 61*a* and 61*b* output polarization-multiplexed laser beams having different wavelengths to a WDM coupler 62. The WDM coupler 62 multiplexes the laser beams outputted from the polarization multiplexing couplers 61*a* and 61*b*, and outputs the multiplexed light beams as a pumping light beam to amplifying fiber 64 via WDM coupler 65. Thus, as seen in FIG. 13, a Raman amplifier using a laser module in accordance with the present invention does not include an external isolator such as isolator 60 of FIG. 17. Therefore, the loss associated with the external isolator, as discussed above, is eliminated from the Raman amplifier system of FIG. 13. Signal light beams to be amplified are input to amplifying fiber 64 from signal light inputting fiber 69 via polarization-dependent isolator 63. The amplified signal light beams are Raman-amplified by being multiplexed with the pumping light beams and input to a monitor light branching coupler 67 via the WDM coupler 65 and the polarization-dependent isolator 66. The monitor light branching coupler 67 outputs a portion of the amplified signal light beams to a control circuit 68, and the remaining amplified signal light beams as an output laser beam to signal light outputting fiber 70.

The control circuit 68 controls a light-emitting state, for example, an optical intensity, of each of the semiconductor light-emitting elements 180*a* through 180*d* based on the portion of the amplified signal light beams input to the control circuit 68. Moreover, control circuit 68 performs feedback control of a gain band of the Raman amplification such that the gain band will be flat over wavelength.

The Raman amplifier described in FIG. 13 realizes all of the advantages of the semiconductor laser device as previously described. For example, although the Raman amplifier illustrated in FIG. 13 is the backward pumping method, since the semiconductor laser modules 60*a* through 60*d* output stable pumping light beams, a stable Raman amplification can be performed whether the Raman amplifier is the forward pumping method or the bi-directional pumping method.

The Raman amplifier can be constructed by wavelength-multiplexing of a plurality of pumping light which are not polarization-multiplexed. That is, the semiconductor laser module of the present invention can be used in a Raman amplifier where the polarization-multiplexing of pumping light is not performed. FIG. 13A is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention. As seen in this figure, laser modules 60A and 60C are directly connected to WDM coupler 62 via a polarization maintaining fiber 71. In this configuration, the angle of the polarization axis of the polarization maintaining fiber against the emitted light from semiconductor laser device is approximately 45 degrees. As mentioned above, since at least 3 longitudinal modes are included in the predetermined spectral width of the output spectrum of the laser light, the coherence length of the laser light becomes shorter and the length of polarization maintaining fiber necessary for depolarizing the laser light becomes markedly short. Thus, it becomes easier to obtain a laser light of low degree of polarization (DOP) which is spectral for reducing the polarization dependency of a Raman amplifier. Therefore, the laser device of the present invention provides a further advantage in that it is possible to substitute 2 units of laser modules which are polarization-multiplexed (as shown in FIG. 13) for one unit of depolarized laser module of greater power (as shown in FIG. 13A), without deteriorating DOP and while obtaining a corresponding reduction in costs.

Figure 14:
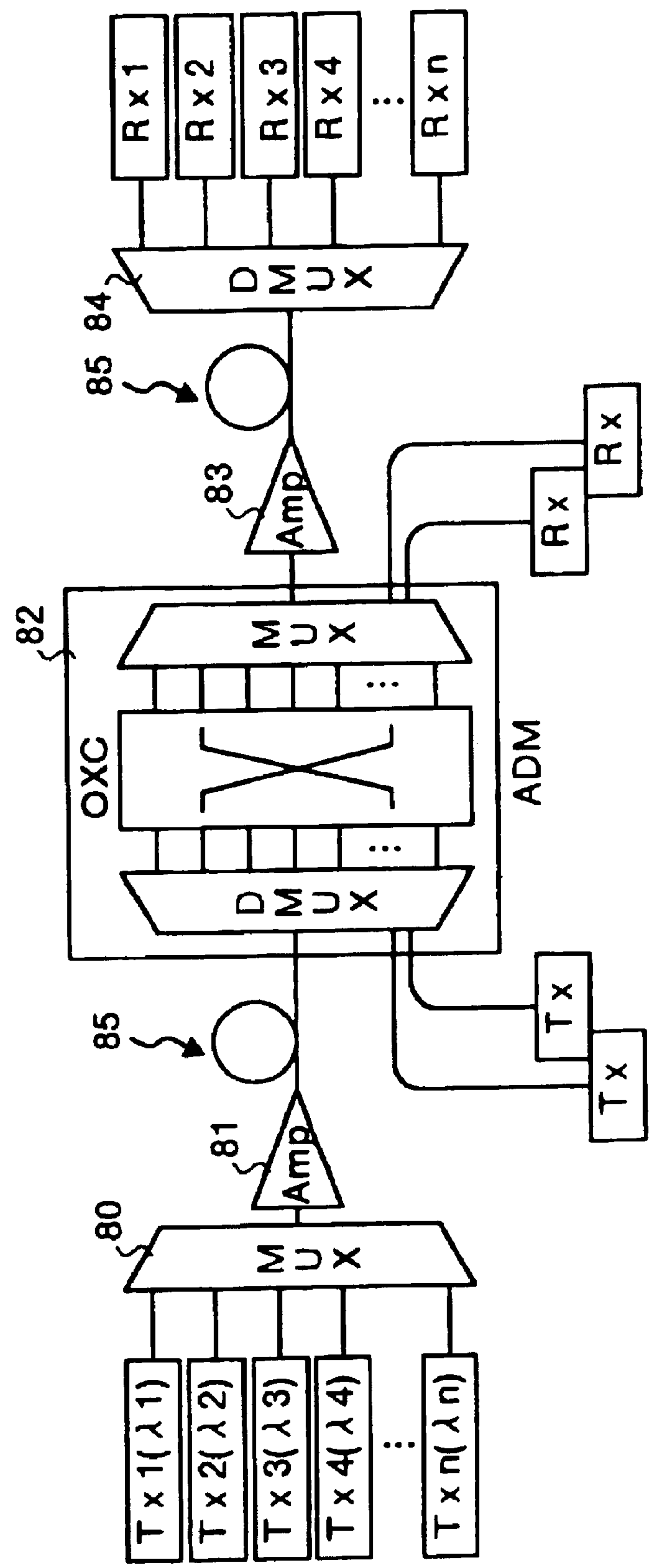
FIG. 14 is a block diagram illustrating a general configuration of a WDM communication system in which the Raman amplifier shown in FIG. 13 is used.
Figure 15B:
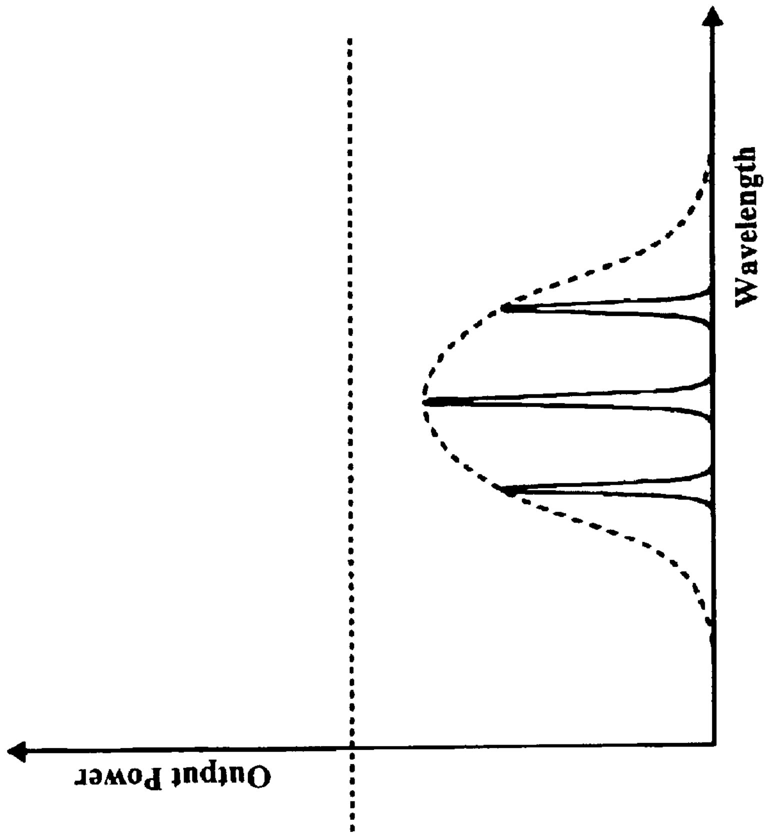
FIGS. 15A and 15B are graphs showing the relationship of laser beam output powers with respect to a single oscillation longitudinal mode and a plurality of oscillation longitudinal modes, and a threshold value of the stimulated Brillouin scattering.
Figure 15A:
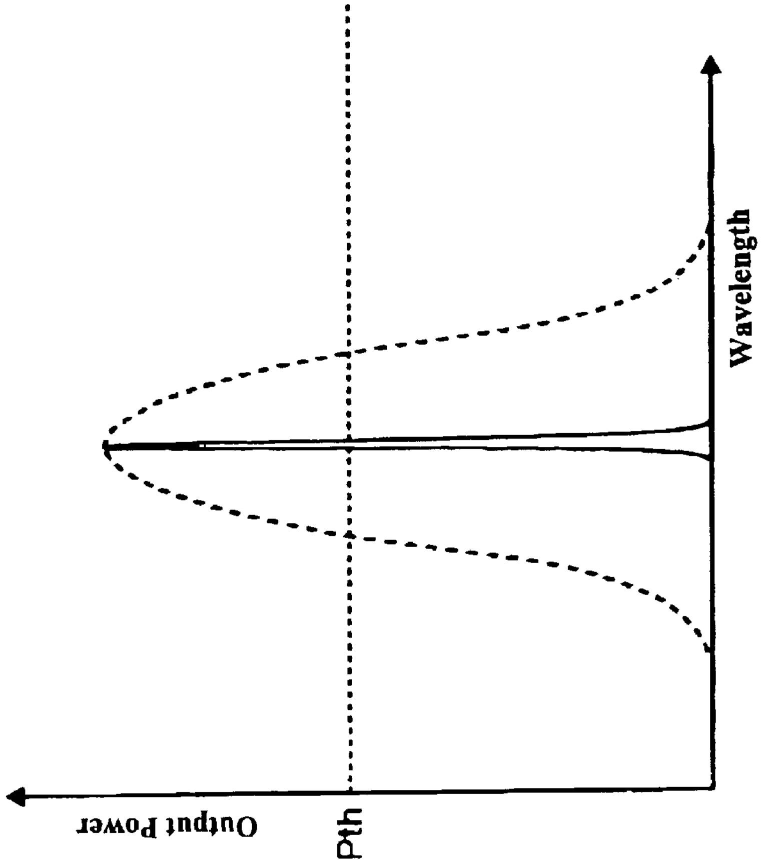

The Raman amplifier illustrated in FIGS. 13 and 13A can be applied to the WDM communication system as described above. FIG. 14 is a block diagram illustrating a general configuration of the WDM communication system to which the Raman amplifier shown in either FIG. 13 or FIG. 13A is applied.

In FIG. 14, optical signals of wavelengths $\lambda_1$ through $\lambda_n$ are forwarded from a plurality of transmitter $Tx_1$ through $Tx_n$ to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIG. 13 are disposed amplifying an attenuated optical signal. A signal transmitted on the optical fiber 85 is divided by an optical demultiplexer 84 into optical signals of a plurality of wavelengths $\lambda_1$ through $\lambda_n$, which are received by a plurality of receivers $Rx_1$ through $Rx_n$. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm.

What is claimed is:

1. A semiconductor laser device comprising:

an active layer configured to radiate light;

a resonant cavity positioned within the laser device and configured to oscillate said light; and a diffraction grating positioned within the semiconductor laser device, wherein said semiconductor laser device is configured to emit a light beam, said light beam having a plurality of longitudinal modes within a full width at half maximum power $\leqq$3 nm of an oscillation wavelength spectrum of the semiconductor laser device, and wherein a length of said resonant cavity is at least 800 $\mu$m.

2. The semiconductor laser device of claim 1, further comprising:

a reflection coating positioned at a first end of said active layer and substantially perpendicular thereto; and an antireflective coating positioned at a second end of said active layer opposing said first end and substantially perpendicular to said active layer, wherein said reflection coating and said antireflective coating define said resonant cavity.

3. The semiconductor laser device of claim 1, wherein a length of said resonant cavity is not greater than 3200 $\mu$m.

4. The semiconductor laser device of claim 1, wherein said diffraction grating is formed substantially along an entire length of said active layer.

5. The semiconductor laser device of claim 1, wherein said diffraction grating comprises a plurality of grating elements having a constant pitch.

6. The semiconductor laser device of claim 4, wherein said diffraction grating comprises a chirped grating having a plurality of grating elements having fluctuating pitches.

7. The semiconductor laser device of claim 6, wherein said chirped grating is formed such that a fluctuation in the pitch of said plurality of grating elements is a random fluctuation.

8. The semiconductor laser device of claim 6, wherein said chirped grating is formed such that a fluctuation in the pitch of said plurality of grating elements is a periodic fluctuation.

9. The semiconductor laser device of claim 1, wherein said diffraction grating is a shortened diffraction grating formed along a portion of an entire length of said active layer.

10. The semiconductor laser device of claim 9, wherein said diffraction grating comprises a plurality of grating elements having a constant pitch.

11. The semiconductor laser device of claim 9, wherein said diffraction grating comprises a chirped grating having a plurality of grating elements having fluctuating pitches.

12. The semiconductor laser device of claim 11, wherein said chirped grating is formed such that a fluctuation in the pitch of said plurality of grating elements is a random fluctuation.

13. The semiconductor laser device of claim 11, wherein said chirped grating is formed such that a fluctuation in the pitch of said plurality of grating elements is a periodic fluctuation.

14. The semiconductor laser device of claim 9, further comprising:

a reflection coating positioned at a first end of said active layer and substantially perpendicular thereto; and an antireflective coating positioned at a second end of said active layer opposing said first end and substantially perpendicular to said active layer, wherein said reflection coating and said antireflective coating define a resonant cavity within said active region.

15. The semiconductor laser device of claim 14, wherein said shortened diffraction grating is positioned along a portion of the active layer in the vicinity of said antireflective coating.

16. The semiconductor laser device of claim 15, wherein said antireflective coating has an ultra-low reflectivity of approximately 0.1% to 2%.

17. The semiconductor laser device of claim 15, wherein said antireflective coating has an ultra-low reflectivity of approximately 0.1% or less.

18. The semiconductor laser device of claim 15, wherein said reflection coating has a high reflectivity of at least 80%.

19. The semiconductor laser device of claim 15, wherein said shortened diffraction grating has a relatively low reflectivity.

20. The semiconductor laser device of claim 15, wherein said shortened diffraction grating has a coupling coefficient K*Lg of approximately 0.3 or less.

21. The semiconductor laser device of claim 15, wherein said shortened diffraction grating has a coupling coefficient K*Lg of approximately 0.1 or less.

22. The semiconductor laser device of claim 14, wherein said shortened diffraction grating is positioned along a portion of the active layer in the vicinity of said reflection coating.

23. The semiconductor laser device of claim 22, wherein said antireflective coating has a low reflectivity of approximately 1% to 5%.

24. The semiconductor laser device of claim 22, wherein said reflection coating has an ultra-low reflectivity of approximately 0.1% to 2%.

25. The semiconductor laser device of claim 22, wherein said reflection coating has an ultra-low reflectivity of approximately 0.1% or less.

26. The semiconductor laser device of claim 22, wherein said shortened diffraction grating has a relatively high reflectivity.

27. The semiconductor laser device of claim 22, wherein said shortened diffraction grating has a coupling coefficient K*Lg of approximately 1 or more.

28. The semiconductor laser device of claim 22, wherein said shortened diffraction grating has a coupling coefficient K*Lg of approximately 3 or more.

29. The semiconductor laser device of claim 14, wherein said shortened diffraction grating comprises a first shortened diffraction grating positioned along a portion of the active layer in the vicinity of said antireflective coating, and a second shortened diffraction grating positioned along a portion of the active layer in the vicinity of said reflection coating.

30. The semiconductor laser device of claim 29, wherein said antireflective coating and said reflection coating have an ultra-low reflectivity of approximately 0.1% to 2%.

31. The semiconductor laser device of claim 29, wherein said antireflective coating and said reflection coating have an ultra-low reflectivity of approximately 0.1% or less.

32. The semiconductor laser device of claim 29, wherein said first shortened diffraction grating comprises a first shortened diffraction grating which has a relatively low reflectivity and second shortened diffraction grating which has a relatively high reflectivity.

33. The semiconductor laser device of claim 29, wherein said first shortened diffraction grating comprises a first shortened diffraction grating having a coupling coefficient K*Lg of approximately 0.3 or less.

34. The semiconductor laser device of claim 29, wherein said first shortened diffraction grating comprises a first shortened diffraction grating having a coupling coefficient K*Lg of approximately 1 or more.

35. A method for providing light from a semiconductor laser device, comprising:

radiating light from an active layer of said semiconductor laser device;

oscillating said light within a resonant cavity of said semiconductor laser device;

providing a diffraction grating within said semiconductor laser device to select a portion of said radiated light to be emitted by said semiconductor laser device as an output light beam; and selecting physical parameters of said semiconductor laser device such that said output light beam has an oscillation wavelength spectrum having a plurality of longitudinal modes located within a full width at half maximum power ≦3 nm of the oscillation wavelength spectrum wherein one of said physical parameters is a length of said resonant cavity being at least 800 μm.

36. The method of claim 35, wherein said step of selecting physical parameters comprises setting a length of a resonant cavity of said semiconductor laser device to provide a predetermined wavelength interval between said plurality of longitudinal modes.

37. The method of claim 36, wherein said step of setting the length of a resonant cavity comprises setting the length such that the wavelength interval between said plurality of longitudinal modes is at least 0.1 nm.

38. The method of claim 37, wherein said step of setting the length of a resonant cavity comprises setting the cavity length to no more than 3,200 μm.

39. The method of claim 36, wherein said step of setting the length of a resonant cavity comprises setting the length such that said plurality of longitudinal modes can be provided within said predetermined spectral width of the oscillation wavelength spectrum.

40. The method of claim 35, wherein said step of selecting physical parameters comprises setting a length of said diffraction grating to be shorter than a length of said active layer to thereby widen said predetermined spectral width of the oscillation wavelength spectrum.

41. The method of claim 40, further comprising positioning said diffraction grating in the vicinity of an antireflective coating of the semiconductor laser device.

42. The method of claim 41, further comprising setting a reflectivity of said antireflective coating to approximately 0.1% to 2%.

43. The method of claim 41, further comprising setting a reflectivity of said antireflective coating to approximately 0.1% or less.

44. The method of claim 41, further comprising setting a reflectivity of a reflection coating opposed to said antireflective coating to at least 80%.

45. The method of claim 41, further comprising setting a reflectivity of said diffraction grating to a relatively low level.

46. The method of claim 41, further comprising setting a coupling coefficient K*Lg of approximately 0.3 or less.

47. The method of claim 41, further comprising setting a coupling coefficient K*Lg of approximately 0.1 or less.

48. The method of claim 46, further comprising positioning said diffraction grating in the vicinity of a reflection coating of the semiconductor laser device.

49. The method of claim 48, further comprising setting a reflectivity of said reflection coating to approximately 0.1% to 2%.

50. The method of claim 48, further comprising setting a reflectivity of said reflection coating to approximately 0.1% or less.

51. The method of claim 48, further comprising setting a reflectivity of an antireflective coating opposed to said reflection coating to approximately 1% to 5%.

52. The method of claim 48, further comprising setting a reflectivity of said diffraction grating to a relatively high level.

53. The method of claim 48, further comprising setting a coupling coefficient K*Lg of approximately 1 or more.

54. The method of claim 48, further comprising setting a coupling coefficient K*Lg of approximately 3 or more.

55. The method of claim 40, further comprising positioning said diffraction grating as a first shortened diffraction grating in the vicinity of an irradiating film of the semiconductor laser device and positioning a second shortened diffraction grating in the vicinity of a reflection coating opposed to said antireflective coating.

56. The method of claim 53, further comprising setting a reflectivity of said antireflective coating and said reflection coating to approximately 0.1% to 2%.

57. The method of claim 53, further comprising setting a reflectivity of said antireflective coating and said reflection coating to approximately 0.1% or less.

58. The method of claim 53, further comprising setting a reflectivity of said first and second diffraction gratings to a relatively low level and a relatively high level respectively.

59. The method of claim 53, further comprising setting a coupling coefficient K*Lg of said first and second diffraction gratings is approximately 0.3 or less, and approximately 1 or more respectively.

60. The method of claim 35, wherein said step of selecting physical parameters comprises forming said diffraction grating as a chirped grating having a plurality of grating elements having fluctuating pitches to thereby widen said predetermined spectral width of the oscillation wavelength spectrum.

61. The method of claim 60, wherein said step of forming said chirped grating comprises forming the chirped grating such that a fluctuation in the pitch of said plurality of grating elements is a random fluctuation.

62. The method of claim 60, wherein said step of forming said chirped grating comprises forming the chirped grating such that a fluctuation in the pitch of said plurality of grating elements is a periodic fluctuation.

* * * * *